(12) United States Patent
Beeson et al.

(10) Patent No.: US 6,960,872 B2
(45) Date of Patent: Nov. 1, 2005

(54) ILLUMINATION SYSTEMS UTILIZING LIGHT EMITTING DIODES AND LIGHT RECYCLING TO ENHANCE OUTPUT RADIANCE

(75) Inventors: Karl W. Beeson, Princeton, NJ (US); Scott M. Zimmerman, Baskin Ridge, NJ (US)

(73) Assignee: Goldeneye, Inc., Carlsbad, CA (US)

( * ) Notice: Subject to any disclaimer, the term of this patent is extended or adjusted under 35 U.S.C. 154(b) by 64 days.

(21) Appl. No.: 10/814,043

(22) Filed: Mar. 30, 2004

(65) Prior Publication Data
US 2004/0232812 A1 Nov. 25, 2004

Related U.S. Application Data

(63) Continuation-in-part of application No. 10/445,136, filed on May 23, 2003, now Pat. No. 6,869,206.

(51) Int. Cl.[7] .............................. F21V 7/00; H01L 33/00
(52) U.S. Cl. ........................ 313/113; 313/498; 362/247; 362/545
(58) Field of Search ........................ 313/110, 112–113, 313/498–512; 362/247, 310, 240, 544–545, 555, 800, 347, 31, 217, 26

(56) References Cited

U.S. PATENT DOCUMENTS

| | | | |
|---|---|---|---|
| 5,410,454 A | | 4/1995 | Murase et al. |
| 6,144,536 A | | 11/2000 | Zimmerman et al. |
| 6,185,357 B1 | | 2/2001 | Zou et al. |
| 6,186,649 B1 | | 2/2001 | Zou et al. |
| 6,280,054 B1 | * | 8/2001 | Cassarly et al. ............ 362/231 |
| 6,488,389 B2 | * | 12/2002 | Cassarly et al. ............ 362/231 |
| 6,550,942 B1 | | 4/2003 | Zou et al. |

* cited by examiner

Primary Examiner—Karabi Guharay
(74) Attorney, Agent, or Firm—William Propp, Esq.

(57) ABSTRACT

An illumination system has a light source that is at least partially enclosed within a light-recycling envelope. The light source is a light-emitting diode that emits light, and a fraction of that light will exit the light-recycling envelope through an aperture. The light-recycling envelope recycles part of the light emitted by the light source back to the light source in order to enhance the output radiance of the light exiting the illumination system.

38 Claims, 16 Drawing Sheets

ILLUMINATION SYSTEMS UTILIZING LIGHT EMITTING DIODES AND LIGHT RECYCLING TO ENHANCE OUTPUT RADIANCE

CROSS REFERENCE TO RELATED APPLICATION

This application is a continuation-in-part of U.S. patent application Ser. No. 10/445,136 filed on May 23,2003, now U.S. Pat. No. 6,869,206, entitled "ILLUMINATION SYSTEMS UTILIZING HIGHLY REFLECTIVE LIGHT EMITTING DIODES AND LIGHT RECYCLING TO ENHANCE BRIGHTNESS," which is herein incorporated by reference. This application is also related to U.S. patent application Ser. No. 10/814,044 entitled "ILLUMINATION SYSTEMS UTILIZING MULTIPLE WAVELENGTH LIGHT RECYCLING" and to U.S. patent application Ser. No. 10/815,005 entitled "PROJECTION DISPLAY SYSTEMS UTILIZING LIGHT EMITTING DIODES AND LIGHT RECYCLING," both of which are filed concurrently with this application and which are herein incorporated by reference.

TECHNICAL FIELD

This invention relates to illumination systems incorporating light-emitting diodes (LEDs). Light-emitting diodes include inorganic light-emitting diodes and organic light-emitting diodes (OLEDs).

BACKGROUND OF THE INVENTION

Illumination systems are used as either stand-alone light sources or as internal light sources for more complex optical systems. Examples of optical systems that utilize or incorporate illumination systems include projection displays, flat-panel displays, avionics displays, automotive lighting, residential lighting, commercial lighting and industrial lighting applications.

Many applications require illumination systems with high brightness and a small effective emitting area. An example of a conventional light source with high brightness and a small effective emitting area is an arc lamp source, such as a xenon arc lamp or a mercury arc lamp. Arc lamp sources may have emitting areas as small as a few square millimeters. An example of a complex optical system that can utilize an illumination system with high brightness and a small effective source area is a projection television display. Current projection television displays typically project the combined images of three small red, green and blue cathode-ray-tube (CRT) devices onto a viewing screen using projection lenses. More recent designs sometimes use a small-area arc lamp source to project images from a liquid crystal display (LCD), a liquid-crystal-on-silicon (LCOS) device or a digital light processor (DLP) device onto a viewing screen. Light sources such as LEDs are currently not used for projection television displays because LED sources do not have sufficient output brightness.

The technical term brightness can be defined either in radiometric units or photometric units. In the radiometric system of units, the unit of light flux or radiant flux is expressed in watts and the unit for brightness is called radiance, which is defined as watts per square meter per steradian (where steradian is the unit of solid angle). The human eye, however, is more sensitive to some wavelengths of light (for example, green light) than it is to other wavelengths (for example, blue or red light). The photometric system is designed to take the human eye response into account and therefore brightness in the photometric system is brightness as observed by the human eye. In the photometric system, the unit of light flux as perceived by the human eye is called luminous flux and is expressed in units of lumens. The unit for brightness is called luminance, which is defined as lumens per square meter per steradian. The human eye is only sensitive to light in the wavelength range from approximately 400 nanometers to approximately 700 nanometers. Light having wavelengths less than about 400 nanometers or greater than about 700 nanometers has zero luminance, irrespective of the radiance values.

In U.S. patent application Ser. No. 10/445,136, brightness enhancement referred to luminance enhancement only. Since luminance is non-zero only for the visible wavelength range of 400 to 700 nanometers, U.S. patent application Ser. No. 10/445,136 is operative only in the 400- to 700-nanometer wavelength range. In the present application, however, brightness enhancement refers to radiance enhancement and is valid for any wavelength throughout the optical spectrum.

In a conventional optical system that transports light from an input source at one location to an output image at a second location, one cannot produce an optical output image whose radiance is higher than the radiance of the light source. A conventional optical system 10 of the prior art is illustrated in cross-section in FIG. 1A. In FIG. 1A, light rays 18 from an input light source 12 are focused by a convex lens 14 to an output image 16. The conventional optical system 10 in FIG. 1A can also be illustrated in a different manner as optical system 20 shown in cross-section in FIG. 1B. For simplicity, the input source 22, the lens 24 and the output image 26 are all assumed to be round. In FIG. 1B, the input source 22 has area, $\text{Area}_{in}$. The light rays from input source 22 fill a truncated cone having edges 21 and 23. The cone, which is shown in cross-section in FIG. 1B, extends over solid angle 27. The magnitude of solid angle 27 is $\Omega_{in}$. Lens 24 focuses the light rays to image 26 having area, $\text{Area}_{out}$. The light rays forming the image 26 fill a truncated cone having edges 25 and 29. The cone, which is shown in cross-section, extends over solid angle 28. The magnitude of solid angle 28 is $\Omega_{out}$.

If the optical system 20 has no losses, the light input flux at the input source 22, $$\Phi_{in}=(\text{Radiance}_{in})(\text{Area}_{in})(\Omega_{in}), \qquad \text{[Equation 1]}$$

equals the light output flux at the output image 26, $$\Phi_{out}=(\text{Radiance}_{out})(\text{Area}_{out})(\Omega_{out}). \qquad \text{[Equation 2]}$$

In these equations, "$\text{Radiance}_{in}$" is the radiance at the input source 22, "$\text{Radiance}_{out}$" is the radiance at the output image 26, "$\text{Area}_{in}$" is the area of the input source 22 and "$\text{Area}_{out}$" is the area of the output image 26. The quantities $\Omega_{in}$ and $\Omega_{out}$ are, respectively, the projected solid angles subtended by the input source and output image light cones. In such a lossless system, it can be shown that $$\text{Radiance}_{in}=\text{Radiance}_{out} \qquad \text{[Equation 3]}$$

and $$(\text{Area}_{in})(\Omega_{in})=(\text{Area}_{out})(\Omega_{out}) \qquad \text{[Equation 4]}$$

If the index of refraction of the optical transmission medium is different at the input source and output image positions, the equality in Equation 4 is modified to become $$(n_{in}^2)(\text{Area}_{in})(\Omega_{in})=(n_{out}^2)(\text{Area}_{out})(\Omega_{out}), \qquad \text{[Equation 5]}$$

where $n_{in}$ is the index of refraction at the input position and $n_{out}$ is the index of refraction at the output position. The quantity $(n^2)(Area)(\Omega)$ is variously called the "etendue" or "optical extent" or "throughput" of the optical system. In a conventional lossless optical system, the quantity $(n^2)(Area)(\Omega)$ is conserved.

In U.S. Pat. No. 6,144,536, herein incorporated by reference, Zimmerman et al demonstrated that for the special case of a source that has a reflecting emitting surface, an optical system can be designed that recycles a portion of the light emitted by the source back to the source and transmits the remainder of the light to an output position. Under certain conditions utilizing such light recycling, the effective luminance of the source as well as the output luminance of the optical system can be higher than the intrinsic luminance of the source in the absence of recycling, a result that is not predicted by the standard etendue equations. In U.S. Pat. No. 6,144,536, the term "luminance" is used for brightness. As previously stated, the term "luminance" is only useful for visible optical wavelengths between 400 and 700 nanometers. Therefore U.S. Pat. No. 6,144,536 is operative only in that spectral region.

An example of a light source with a reflecting emitting surface is a conventional fluorescent lamp. A cross-section of a conventional fluorescent lamp 30 is shown in FIG. 2A. The fluorescent lamp 30 has a glass envelope 32 enclosing a hollow interior 36. The hollow interior 36 is filled with a gas that can emit ultraviolet light when a high voltage is applied. The ultraviolet light excites a phosphor coating 34 on the inside surface of the glass envelope, causing the phosphor to emit visible light through the phosphor coating 34. The phosphor coating 34 is a partially reflecting surface in addition to being a light emitter. Therefore, it is possible to design an optical system that recycles a portion of the visible light generated by the phosphor coating 34 back to the coating 34 and thereby cause an increase in the effective brightness of the conventional fluorescent lamp.

The disclosures on light recycling in U.S. Pat. No. 6,144,536 relate to linear light sources that have long emitting apertures with aperture areas greater than 100 square millimeters ($mm^2$). Such configurations, which typically use fluorescent lamps as light sources, are not suitable for many applications such as illumination systems for large projection displays. At the application date for U.S. Pat. No. 6,144,536, a typical LED had an output of only 1 lumen per square millimeter ($mm^2$) and a light reflectivity of less than 20%. To make an illumination system that produces 1000 lumens output for a projection display would require at least 1000 LEDs having a total LED surface area of 1000 $mm^2$. If 1000 low-reflectivity, low-output LEDs are placed on the inside surface of a light-recycling envelope that has a 10 $mm^2$ output aperture and that has a total inside area of 1010 $mm^2$ (including the area of the output aperture), the overall output efficiency will be less than 2%. Less than 20 lumens from the original 1000 lumens will exit the light-recycling envelope. Such an illumination system is not very practical.

Recently, highly reflective green, blue and ultraviolet LEDs and diode lasers based on gallium nitride (GaN), indium gallium nitride (InGaN) and aluminum gallium nitride (AlGaN) semiconductor materials have been developed. Some of these LED devices have high light output, high radiance and have a light-reflecting surface that can reflect at least 50% of the light incident upon the device. The reflective surface of the LED can be a specular reflector or a diffuse reflector. Typically, the reflective surface of the LED is a specular reflector. Radiance outputs close to 7000 watts per square meter per steradian and total outputs of approximately 0.18 watt from a single packaged device are possible. Light outputs per unit area can exceed 0.045 watt/$mm^2$. As such, several new applications relating to illumination systems have become possible. Advantages such as spectral purity, reduced heat, and fast switching speed all provide motivation to use LEDs and semiconductor lasers to replace fluorescent, incandescent and arc lamp sources.

FIG. 2B illustrates a cross-sectional view of a recently developed type of LED 40 that has an emitting layer 46 located below both a transparent top electrode 43 and a second transparent layer 44. Emitting layer 46 emits light rays 45 when an electric current is passed through the device 40. Below the emitting layer 46 is a reflecting layer 47 that also serves as a portion of the bottom electrode. Electrical contacts 41 and 42 provide a pathway for electrical current to flow through the device 40. It is a recent new concept to have both electrical contacts 41 and 42 on the backside of the LED opposite the emitting surface. Typical prior LED designs placed one electrode on top of the device, which interfered with the light output from the top surface and resulted in devices with low reflectivity. The reflecting layer 47 allows the LED to be both a light emitter and a light reflector. Lumileds Lighting LLC, for example, produces highly reflective green, blue and ultraviolet LED devices of this type. It is expected that highly reflective red and infrared LEDs with high outputs and high radiance will also eventually be developed. However, even the new green, blue and ultraviolet gallium nitride, indium gallium nitride and aluminum gallium nitride LEDs do not have sufficient radiance for many applications.

LEDs, including inorganic light-emitting diodes and organic light-emitting diodes, emit incoherent light. On the other hand, semiconductor laser light sources, such as edge-emitting laser diodes and vertical cavity surface emitting lasers, generally emit coherent light. Coherent semiconductor laser light sources typically have higher brightness than incoherent light sources, but semiconductor laser light sources are not suitable for many applications such as displays due to the formation of undesirable speckle light patterns that result from the coherent nature of the light.

It would be highly desirable to develop incoherent illumination systems based on LEDs that utilize light recycling to increase the illumination system output radiance. Possible applications include projection displays, flat-panel displays, avionics displays, automotive lighting, residential lighting, commercial lighting and industrial lighting.

SUMMARY OF THE INVENTION

This invention is an illumination system that is comprised of a light source, a light-recycling envelope and at least one light output aperture. The light source is at least one light-emitting diode that emits light. The at least one light-emitting diode is further comprised of an emitting layer that emits light and a reflecting layer that has reflectivity $R_S$ and that reflects light. The total light-emitting area of the light source is area $A_S$ and the light emitted by the light source has a maximum intrinsic source radiance.

The light-recycling envelope at least partially encloses the light source and has reflectivity $R_E$. The light-recycling envelope reflects and recycles part of the light emitted by the emitting layer back to the reflecting layer of the light-emitting diode.

The at least one light output aperture is located in a surface of the light-recycling envelope. The total light output aperture area is area $A_O$ and area $A_O$ is less than area $A_S$. The light source and the light-recycling envelope direct at least a fraction of the light out of the light-recycling envelope through the at least one light output aperture. The fraction of the light that exits the at least one light output aperture exits as incoherent light having a maximum exiting radiance. Under some conditions utilizing light recycling, the maximum exiting radiance is greater than the maximum intrinsic source radiance of the light source.

BRIEF DESCRIPTION OF THE DRAWINGS

A more complete understanding of the present invention, as well as other objects and advantages thereof not enumerated herein, will become apparent upon consideration of the following detailed description and accompanying drawings, wherein.

DETAILED DESCRIPTION OF THE PREFERRED EMBODIMENTS

Figure 1A:
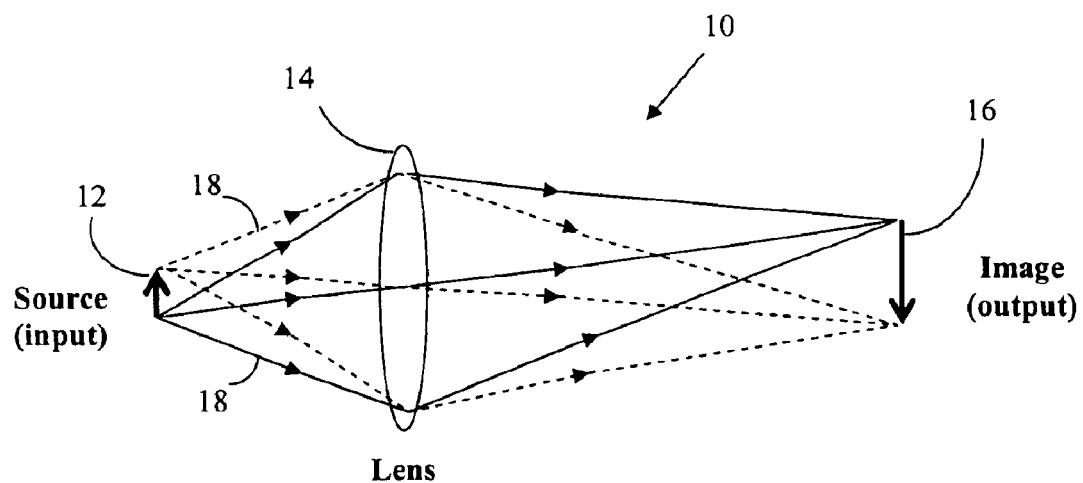
FIGS. 1A and 1B are cross-sectional side views of conventional optical systems of the prior art.
Figure 1B:
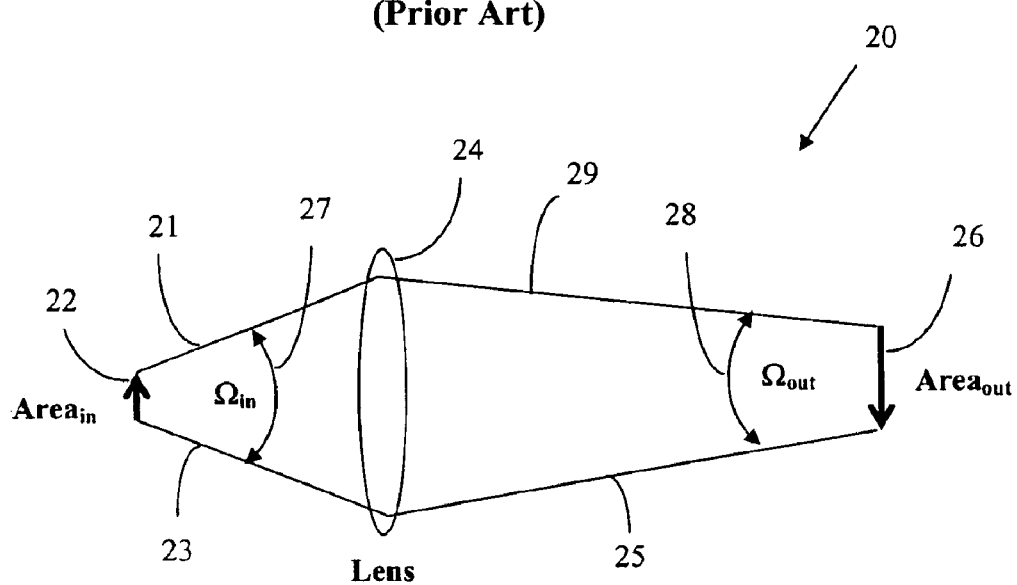
Figure 2A:
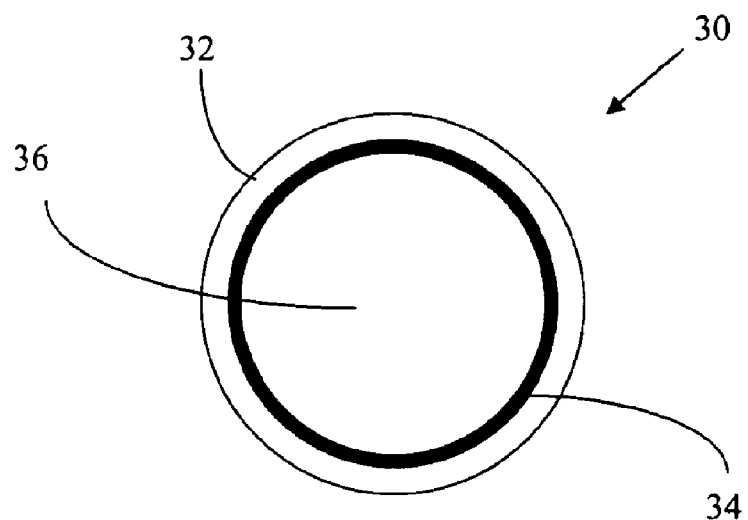
FIGS. 2A and 2B are cross-sectional views of prior art light sources that have both emitting and reflecting surfaces.
Figure 2B:
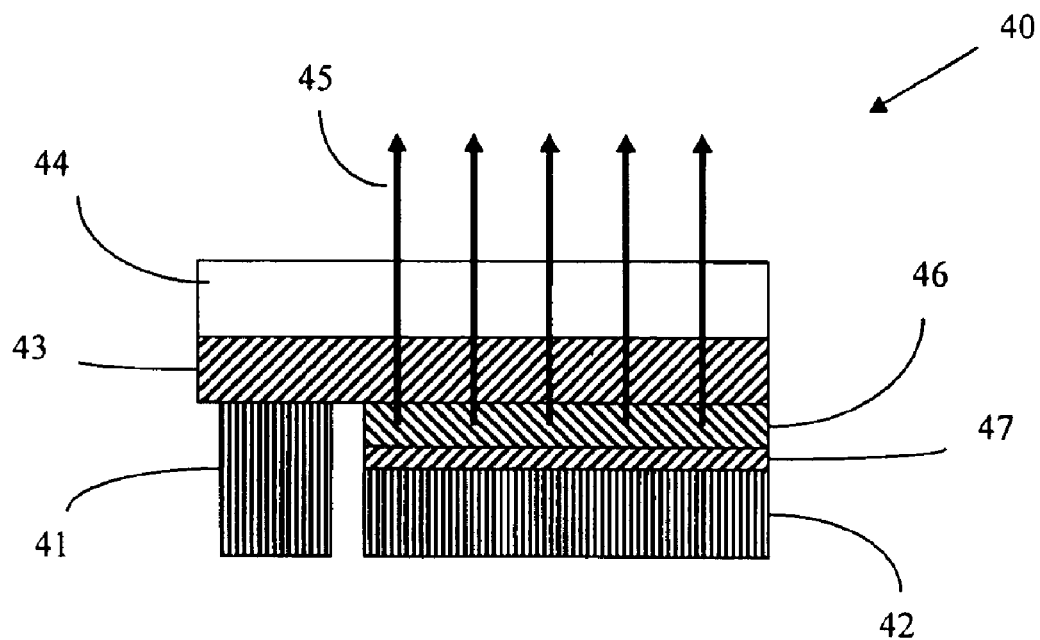

The preferred embodiments of the present invention will be better understood by those skilled in the art by reference to the above FIGURES. The preferred embodiments of this invention illustrated in the FIGURES are not intended to be exhaustive or to limit the invention to the precise form disclosed. The FIGURES are chosen to describe or to best explain the principles of the invention and its applicable and practical use to thereby enable others skilled in the art to best utilize the invention.

The embodiments of this invention are comprised of at least a light source, a light-recycling envelope and a light output aperture located in the surface of the light-recycling envelope.

The preferred light source of this invention comprises at least one light-emitting diode (LED). Preferred LEDs are inorganic light-emitting diodes and organic light-emitting diodes (OLEDs) that both emit light and reflect light. More preferred LEDs are inorganic light-emitting diodes due to their higher light output brightness. The light emitted by the light source is preferably greater that 200 nanometers in wavelength and less than 3000 nanometers in wavelength.

Various illumination systems that utilize LEDs are illustrated in FIGS. 3–12. An LED depicted in FIGS. 3–12 may be any LED that both emits light and reflects light. Examples of LEDs that both emit and reflect light include inorganic light-emitting diodes and OLEDs. Inorganic light-emitting diodes can be fabricated from materials containing gallium nitride, aluminum gallium nitride, indium gallium nitride, aluminum nitride, aluminum indium gallium phosphide, gallium arsenide, indium gallium arsenide or indium gallium arsenide phosphide, for example, but are not limited to such materials. OLEDs may be constructed from a variety of light-emitting organic small molecules or polymers. Appropriate small molecules include, for example, tris (8-hydroxyquinoline) aluminum(III), which can be abbreviated as $Alq_3$, and certain types of chelates, oxadiazoles, imidazoles, benzidines and triarylamines, but are not limited to such materials. Appropriate polymers include, for example, poly(ethylene dioxythiophene) and poly(styrene sulfonate).

For purposes of simplifying the FIGURES, each LED in FIGS. 3–12 is illustrated in an identical manner and each LED is shown as being comprised of two elements, an emitting layer that emits light and a reflecting layer that reflects light. Note that typical LEDs are normally constructed with more than two elements, but for the purposes of simplifying the FIGS. 3–12, the additional elements are not shown. Some of the embodiments of this invention may contain two or more LEDs. Although each LED in FIGS. 3–12 is illustrated in an identical manner, it is within the scope of this invention that multiple LEDs in an embodiment may not all be identical. For example, if an embodiment of this invention has a plurality of LEDs, it is within the scope of this invention that some of the LEDs may be inorganic light-emitting diodes and some of the LEDs may be OLEDs. As a further example of an illumination system having multiple LEDs, if an embodiment of this invention has a plurality of LEDs, it is also within the scope of this invention that some of the LEDs may emit different colors of light. Example LED colors include, but are not limited to, wavelengths in the infrared, visible and ultraviolet regions of the optical spectrum. For example, one or more of the LEDs in a light-recycling envelope may be a red LED, one or more of the LEDs may be a green LED and one or more of the LEDs may be a blue LED. If an embodiment, for example, contains red, green and blue LEDS, then the red, green and blue LEDs may be powered concurrently to produce a single composite output color such as white light. Alternatively, the red, green and blue LEDs in this example may each be powered at different times to produce different colors in different time periods.

Preferred LEDs have at least one reflecting layer that reflects light incident upon the LED. The reflecting layer of the LED may be either a specular reflector or a diffuse reflector. Typically, the reflecting layer is a specular reflector. Preferably the reflectivity $R_S$ of the reflecting layer of the LED is at least 50%. More preferably, the reflectivity $R_S$ is at least 70%. Most preferably, the reflectivity $R_S$ is at least 90%.

Each LED in FIGS. 3–8 and 10–12 is illustrated with an emitting layer facing the interior of the light-recycling envelope and a reflecting layer positioned behind the emitting layer and adjacent to the inside surface of the light-recycling envelope. In this configuration, light can be emitted from all surfaces of the emitting layer that are not in contact with the reflecting layer. It is also within the scope of this invention that a second reflecting layer can be placed on the surface of the emitting layer facing the interior of the light-recycling envelope. In the latter example, light can be emitted from the side surfaces of the emitting layer that do not contact either reflecting layer. A second reflecting layer is especially important for some types of LEDs that have an electrical connection on the top surface of the emitting layer since the second reflecting layer can improve the overall reflectivity of the LED.

The total light-emitting area of the light source is area $A_S$. If there is more than one LED within a single light-recycling envelope, the total light-emitting area $A_S$ of the light source is the total light-emitting area of all the LEDs in the light-recycling envelope.

A light source, whether comprising one LED or a plurality of LEDs, has a maximum intrinsic source radiance that depends on the light source design and the driving electrical power applied to the light source. The maximum intrinsic source radiance is determined in the following manner. First, the radiance is measured for each LED in the light source when the light-recycling envelope is not present and when no other LED is directing light to the LED under measurement. The measurements are done with each LED powered at the same level as in the illumination system and are done as a function of emitting angle. From these radiance measurements, a maximum radiance value can be determined for all the LEDs. This maximum value is defined as the maximum intrinsic source radiance.

The light-recycling envelope of this invention is a light-reflecting element that at least partially encloses the light source. The light-recycling envelope may be any three-dimensional surface that encloses an interior volume. For example, the surface of the light-recycling envelope may be in the shape of a cube, a rectangular three-dimensional surface, a sphere, a spheroid, an ellipsoid, an arbitrary three-dimensional facetted surface or an arbitrary three-dimensional curved surface. Preferably the three-dimensional shape of the light-recycling envelope is a facetted surface with flat sides in order to facilitate the attachment of LEDs to the inside surfaces of the envelope. Preferable three-dimensional shapes have a cross-section that is a square, a rectangle or a polygon.

The light-recycling envelope reflects and recycles part of the light emitted by the light source back to the light source. Preferably the reflectivity $R_E$ of the inside surfaces of the light-recycling envelope is at least 50%. More preferably, the reflectivity $R_E$ is at least 70%. Most preferably, the reflectivity $R_E$ is at least 90%. Ideally, the reflectivity $R_E$ should be as close to 100% as possible in order to maximize the efficiency and the maximum exiting radiance of the illumination system.

The light-recycling envelope may be fabricated from a bulk material that is intrinsically reflective. A bulk material that is intrinsically reflective may be a diffuse reflector or a specular reflector. Preferably a bulk material that is intrinsically reflective is a diffuse reflector. Diffuse reflectors reflect light rays in random directions and prevent reflected light from being trapped in cyclically repeating pathways. Specular reflectors reflect light rays such that the angle of reflection is equal to the angle of incidence.

Alternatively, if the light-recycling envelope is not fabricated from an intrinsically reflective material, the interior surfaces of the light-recycling envelope must be covered with a reflective coating. The reflective coating may be a specular reflector, a diffuse reflector or a diffuse reflector that is backed with a specular reflecting layer. Diffuse reflectors typically need to be relatively thick (a few millimeters) in order to achieve high reflectivity. The thickness of a diffuse reflector needed to achieve high reflectivity can be reduced if a specular reflector is used as a backing to the diffuse reflector.

Diffuse reflectors can be made that have very high reflectivity (for example, greater than 95% or greater than 98%). However, diffuse reflectors with high reflectivity are generally quite thick. For example, diffuse reflectors with reflectivity greater than 98% are typically several millimeters thick. Examples of diffuse reflectors include, but are not limited to, fluoropolymer materials such as Spectralon™ from Labsphere, Inc. and polytetrafluoroethylene film from manufacturers such as Fluorglas (sold under the trade name Furon™), W. L. Gore and Associates, Inc. (sold under the trade name DR™), or E. I. du Pont de Nemours & Company (sold under the trade name of Teflon™), films of barium sulfate, porous polymer films containing tiny air channels such as polyethersulfone and polypropylene filter materials made by Pall Gelman Sciences, and polymer composites utilizing reflective filler materials such as, for example, titanium dioxide. An example of the latter polymer composite material is titanium dioxide filled ABS (acrylonitrile-butadiene-styrene terpolymer) produced by RTP. In the case that a polymer composite material is employed as a reflective material, such as titanium dioxide filled ABS, the light-recycling envelope can be formed from the polymer composite material and a separate light-reflecting layer is not needed on the interior surfaces of the light-recycling envelope.

Most specular reflective materials have reflectivity ranging from about 80% to about 98.5%. Examples of specular reflective materials include, but are not limited to, Silverlux™, a product of 3M Corporation, and other carrier films of plastic that have been coated with a thin metallic layer such as silver, aluminum or gold. The thickness of the metallic coating may range from about 0.05 micrometers to about 0.1 millimeter, depending on the materials used and the method of manufacturing the metal coating. Other examples of specular reflective films that have high reflectivity include photonic bandgap reflective materials and Vikuiti™ ESR (Enhanced Specular Reflector) made by 3M Corporation. The ESR film has a reflectivity of greater than 98% across the visible light spectrum.

The interior volume of the light-recycling envelope that is not occupied by the light source may be occupied by a vacuum, may be filled with a light transmitting gas or may be filled or partially filled with a light-transmitting solid. Any gas or solid that fills or partially fills the light-recycling envelope should transmit light emitted by the light source. Examples of light-transmitting gases are air, nitrogen and inert gases such as argon. Examples of light-transmitting solids include inorganic glasses such as silicon dioxide or sapphire and organic polymers such as polymethylmethacrylate, polystyrene, polycarbonate or a silicone-containing material.

The light-recycling envelope has at least one light output aperture. The light source and the light-recycling envelope direct at least a fraction of the light emitted by the light source out of the light-recycling envelope through the at least one light output aperture as incoherent light having a maximum exiting radiance. The maximum exiting radiance is experimentally determined by measuring the exiting radiance over the full range of exiting angles and determining the maximum measured value. The total light output aperture area is area $A_O$. If there is more than one output aperture in the light-recycling envelope, $A_O$ refers to the combined area of all the output apertures. An output aperture may have any shape including, but not limited to, a square, a rectangle, a polygon, a circle, an ellipse, an arbitrary facetted shape or an arbitrary curved shape.

Various embodiments of this invention that utilize light recycling will now be described.

Figure 3A:
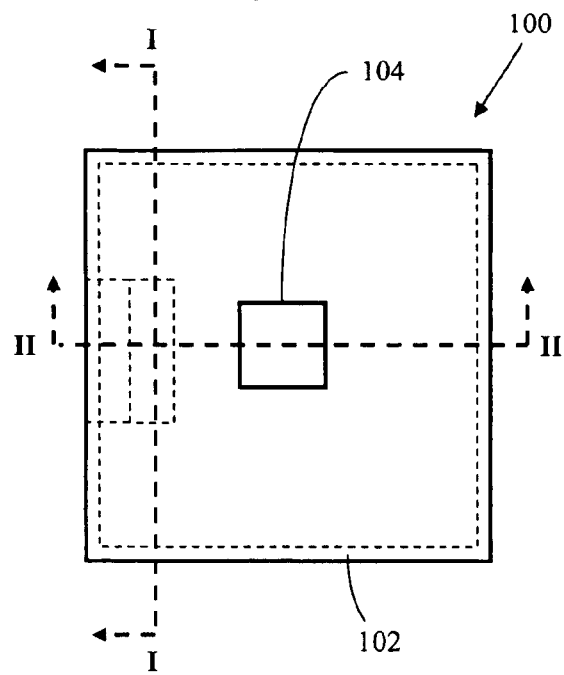
FIGS. 3A, 3B, 3C, 3D and 3E illustrate an embodiment of this invention that has one light-emitting diode.
Figure 3B:
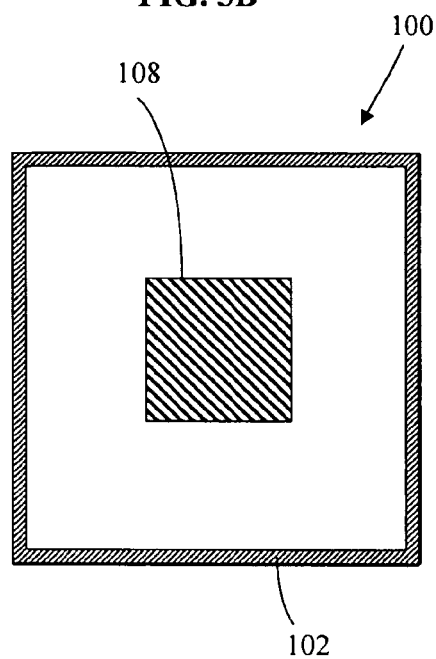
Figure 3C:
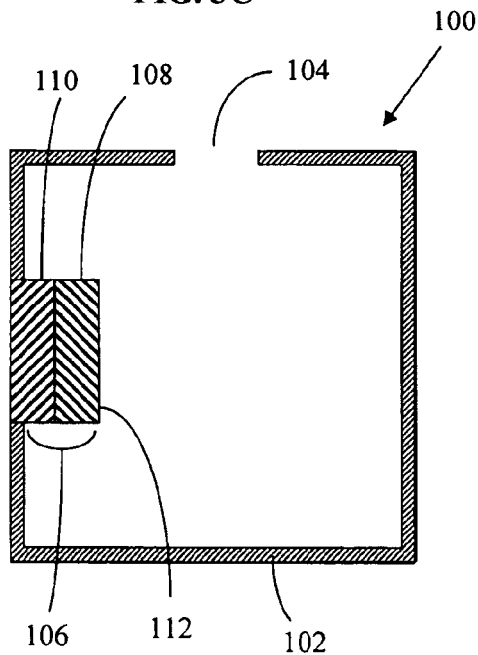
Figure 3D:
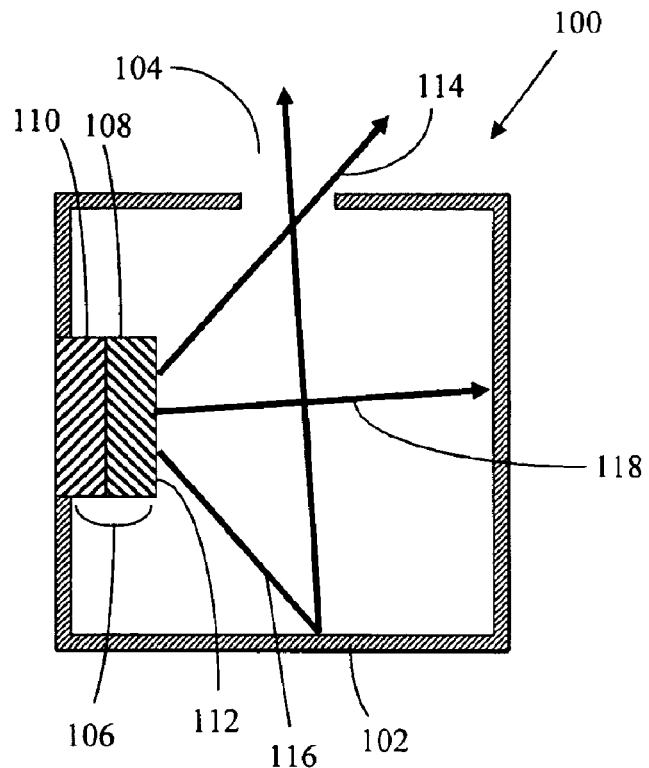
Figure 3E:
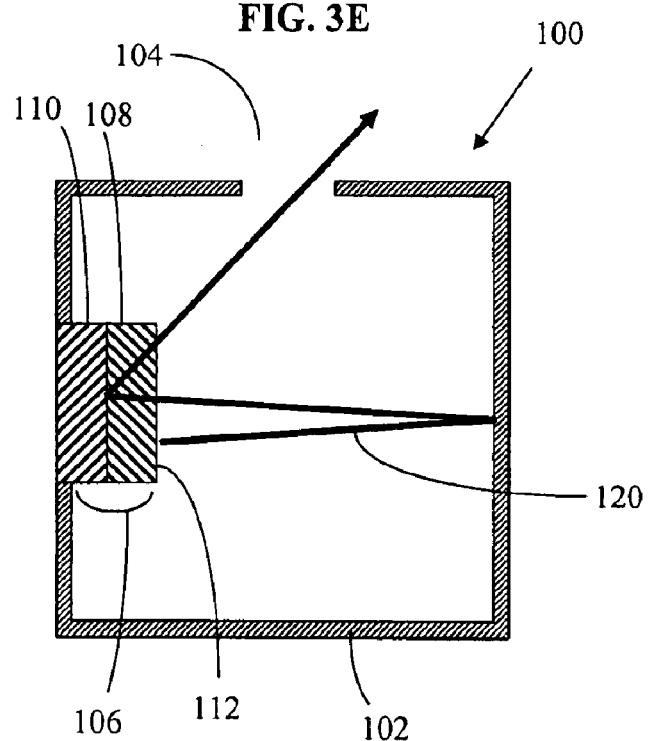

One embodiment of this invention is illumination system 100 shown FIGS. 3A, 3B, 3C, 3D, and 3E. FIG. 3A is a top exterior view of illumination system 100 showing the outer edge of a light-recycling envelope 102 and a light output aperture 104 as solid lines in the figure. FIG. 3B is a cross-sectional view along the I—I plane indicated in FIG. 3A. FIG. 3C is a cross-sectional view along the II—II plane indicated in FIG. 3A. The II—II plane passes through the light output aperture 104 and LED 106. FIGS. 3D and 3E show the paths of some representative light rays emitted from LED 106.

The cubical three-dimensional shape of the surface of the light-recycling envelope 102, the square cross-sectional shape of the light-recycling envelope 102 and the square shape of the light output aperture 104 are illustrative examples used for ease of understanding of the descriptions. It should also be noted that the drawing is merely a representation of the structure; the actual and relative dimensions may be different.

As noted previously, the light-recycling envelope 102 may be any three-dimensional surface that encloses an interior volume. For example, the surface of the light-recycling envelope may be in the shape of a cube, a rectangular three-dimensional surface, a sphere, a spheroid, an ellipsoid, an arbitrary three-dimensional facetted surface or an arbitrary three-dimensional curved surface. Preferably the three-dimensional shape of the light-recycling envelope is a facetted surface with flat sides in order to facilitate the attachment of LEDs to the inside surfaces of the envelope. The only requirement for the three-dimensional shape of the light-recycling envelope is that a fraction of any light emitted from an LED within the light-recycling envelope must also exit from the light output aperture of the light-recycling envelope within a finite number of reflections within the light-recycling envelope, i.e. there are no reflective dead spots within the light-recycling envelope where the light emitted from the LED will endlessly reflect without exiting the light-recycling envelope through the light output aperture.

The cross-section of the light-recycling envelope 102, such as the square cross-section shown in FIG. 3C, may have any shape, both regular and irregular, depending on the shape of the three-dimensional surface. Other examples of possible cross-sectional shapes include a rectangle, a taper, a polygon, a circle, an ellipse, an arbitrary facetted shape or an arbitrary curved shape. Preferable cross-sectional shapes are a square, a rectangle or a polygon.

In illumination system 100, the inside surfaces of the light-recycling envelope 102, except for the area covered by the LED 106 and the area occupied by the light output aperture 104, are light reflecting surfaces. In order to achieve high light reflectivity, the light-recycling envelope 102 may be fabricated from a bulk material that is intrinsically reflective or the inside surfaces of the light-recycling envelope 102 may be covered with a reflective coating. The bulk material or the reflective coating may be a specular reflector, a diffuse reflector or a diffuse reflector that is backed with a specular reflecting layer. Examples of reflective materials were described previously. Preferably the reflectivity $R_E$ of the inside surfaces of the light-recycling envelope 102 that are not occupied by the LED 106 and the light output aperture 104 is at least 50%. More preferably, the reflectivity $R_E$ is at least 70%. Most preferably, the reflectivity $R_E$ is at least 90%. Ideally, the reflectivity $R_E$ should be as close to 100% as possible in order to maximize the efficiency and the maximum exiting radiance of the illumination system.

The square cross-sectional shape of illumination system 100 shown in FIG. 3C has a first side containing the light output aperture 104, a second side, a third side and a fourth side. The first side is opposite and parallel to the third side. The second side is opposite and parallel to the fourth side. The first side and third side are perpendicular to the second side and fourth side. The four sides of the illumination system shown in cross-section in FIG. 3C plus the two remaining sides (not shown in the cross-sectional view) of the six-sided cube form the interior of the light-recycling envelope.

The light source for illumination system 100 is LED 106, which emits light of any optical wavelength or range of wavelengths and which is positioned interior to the fourth side of the illumination system. LED 106 may be any inorganic light-emitting diode or an OLED. Preferably, LED 106 is an inorganic light-emitting diode. Preferably the wavelength of the light emitted by LED 106 is greater than 200 nanometers and less than 3000 nanometers. If the light emitted by LED 106 is ultraviolet light, preferably the wavelength is greater than 200 nanometers and less than 400 nanometers. If the light emitted by LED 106 is infrared light, preferably the wavelength is greater than 700 nanometers and less than 3000 nanometers.

LED 106 has a reflecting layer 110 and an emitting layer 108. The reflecting layer is adjacent to and interior to the fourth side while the emitting layer extends into the interior of the light-recycling envelope. The reflecting layer 110 may be a specular reflector or a diffuse reflector. In a typical inorganic light-emitting diode, the reflecting layer, if present, is usually a specular reflector. The light reflectivity of reflecting layer 110 of LED 106 is $R_S$. If the reflectivity varies across the area of the reflecting layer, the reflectivity $R_S$ is defined as the average reflectivity of the reflecting layer. The reflectivity $R_S$ of reflecting layer 110 is preferably at least 50%. More preferably, the reflectivity $R_S$ of reflecting layer 110 is at least 70%. Most preferably, the reflectivity $R_S$ of reflecting layer 110 is at least 90%. Ideally, the reflectivity $R_S$ should be as close to 100% as possible in order to maximize the efficiency and the maximum exiting radiance of the illumination system.

The total light-emitting area of the light source is area $A_S$. In FIGS. 3A–3E, the light source consists of just one LED, so the total light-emitting area $A_S$ of the light source is the light-emitting area of LED 106.

The light output from the light source, in this case LED 106, has a maximum intrinsic source radiance that depends on the light source design and the driving electrical power applied to the light source. The maximum intrinsic source radiance of the light source can be determined by measuring an identically constructed and identically powered LED that is not enclosed in a light-recycling envelope.

The light output aperture 104 is in the first side of the illumination system. A fraction of the light coming from the light source and the light-recycling envelope exits the light output aperture. As noted, the aperture may have any shape including, but not limited to, a square, a rectangle, a polygon, a circle, an ellipse, an arbitrary facetted shape or an arbitrary curved shape. The total light output aperture area is area $A_O$, which in this case is just the area of the single light output aperture 104. If the illumination system has more than one light output aperture, the area $A_O$ is the total area of all the light output apertures.

Light may be emitted from emitting layer 108 of LED 106 through one or more of the surfaces of emitting layer 108 that do not contact reflecting layer 110. For example, light may be emitted through surface 112. Four illustrative examples of light rays emitted through surface 112 are shown in FIGS. 3D and 3E.

In FIG. 3D, a first light ray 114 emitted from the surface 112 of emitting layer 108 of the LED 106 on the fourth side passes through the interior of the light-recycling envelope 102 to exit through the light output aperture 104 on the first side without reflecting off the reflecting sides of the light-recycling envelope.

A second light ray 116 emitted from the surface 112 of the emitting layer 108 of the LED 106 passes through the interior of the light-recycling envelope and is reflected by the light-recycling envelope 102 on the third side. The reflected ray 116 then passes through the interior of the light-recycling envelope to exit through the light output aperture 104 on the first side. This is merely an illustrative example since the second ray 116 can reflect a finite number of times from the reflective surfaces of any and all of the sides before exiting the light-recycling envelope through the light output aperture.

A third light ray 118 emitted from the surface 112 of the emitting layer 108 of LED 106 passes through the interior of the light-recycling envelope 102 and is absorbed by the light-recycling envelope 102 on the second side. In general, the light-recycling envelope is not a perfect reflector and has a reflectivity less than 100%. Some of the light, such as light ray 118, will be absorbed. Due to the absorption losses, only a fraction of the light that is inside the light-recycling envelope will exit the light-recycling envelope through the light output aperture 104.

In FIG. 3E, a fourth light ray 120 emitted from the surface 112 of the emitting layer 108 of the LED 106 during a first time period passes through the interior of the light-recycling envelope 102 and is reflected by the light-recycling envelope on the second side. The reflected fourth light ray passes through the interior of the light-recycling envelope and is recycled back to the light source. The fourth light ray 120 is transmitted through surface 112 and the emitting layer 108 of the LED 106 to reflect off the reflecting layer 110 of the LED 106. The fourth light ray 120 then is transmitted through the emitting layer 108 of LED 106 and through the surface 112 during a second time period, passes through the interior of the light-recycling envelope and finally exits the light output aperture 104.

Light rays 114, 116 and 118 are not recycled back to the light source. Light ray 120 is recycled back to the light source. Only part of the light emitted by the light source is recycled back to the light source.

When the fourth light ray 120 reflects off reflecting layer 110 of LED 106 and is transmitted through emitting layer 108 and surface 112 to enter the light-recycling envelope during the second time period, the reflected light ray 120 adds to the light rays concurrently being emitted by emitting layer 108 of LED 106 during the second time period. The reflected light ray increases the effective source radiance of LED 106 so that the effective source radiance is then higher than the maximum intrinsic source radiance of LED 106 measured in the absence of light recycling.

The maximum exiting radiance of the light exiting the light output aperture cannot be greater than the effective radiance of the light source. However, by recycling a part of the light emitted by the light source back to the light source, the effective radiance of the light source can be increased so that the maximum exiting radiance of the light exiting the light output aperture can then be greater than the maximum intrinsic source radiance of an identical LED measured in the absence of light recycling. Note that when the maximum exiting radiance of the light exiting the light output aperture of illumination system 100 is compared to the maximum intrinsic source radiance of an identical LED in the absence of light recycling, the LED 106 of the illumination system 100 and the identical LED used in the reference measurement are of the same design and are operated at the same electrical power.

The fourth light ray 120 will be unaffected transmitting through the emitting layer 108 of LED 106 whether the emitting layer 108 is emitting light or not. The fourth light ray 120 could, alternatively, reflect off the light-recycling envelope on the first or third side before reflecting off the reflecting layer 110 of the LED on the fourth side.

This is merely an illustrative example since the fourth light ray 120 can reflect a finite number of times from the reflective surfaces of any and all the sides before or after reflecting off the reflecting layer 110 of the LED, once or any finite number of times, before the fourth light ray exits the light-recycling envelope through the light output aperture 104.

The maximum reflectivity of the inside surfaces of illumination system 100 and the resulting maximum exiting radiance exiting from the light output aperture 104 is achieved by preferably having the entire interior surfaces of illumination system 100 be reflective except for the total area $A_O$ of all the apertures in the light-recycling envelope. Illumination system 100 has one light output aperture 104 having area $A_O$. The total inside area of the light-recycling envelope is $A_T$, which includes area $A_O$ and the total light-emitting area of the light source. The LED light source has a reflecting layer 110 having reflectivity $R_S$. The total light-emitting area of the light source is area $A_S$. In the example of FIGS. 3A–3E, area $A_S$ is the light-emitting area of LED 106, but for other examples having more than one LED, $A_S$ is the total light-emitting area of all the LEDs within the light-recycling envelope. The remaining inside area of the light-recycling envelope that is not covered by the total light-emitting area $A_S$ of the LED and the area $A_O$ of the output aperture or apertures is denoted as remaining area $A_R$. Preferably the entire remaining area $A_R$ of the light-recycling envelope should have a reflective surface of reflectivity $R_E$ to maximize the radiance exiting from the light output aperture or apertures. As noted previously, the reflectivity $R_E$ is preferably at least 50%. More preferably, the reflectivity $R_E$ is at least 70%. Most preferably, the reflectivity $R_E$ is at least 90%. Ideally the reflectivity $R_E$ should be as close to 100% as possible in order to maximize the efficiency and the maximum exiting radiance of the illumination system.

Since the area $A_S$ and the area $A_R$ are not perfect reflectors and do absorb some of the light during each reflection, the maximum illumination system efficiency and the maximum exiting radiance are achieved by minimizing the number of light reflections. For a given fixed total light-emitting area $A_S$ and a given fixed total area $A_O$ of the light output aperture or apertures, the maximum exiting radiance directed from the light output aperture or apertures is achieved by minimizing the remaining area $A_R$ in order to minimize the number of reflections. Usually it is not possible for the remaining area $A_R$ to be zero, however, since it is usually not possible to arrange the one or more LEDs in the illumination system to cover the entire area of the light-recycling envelope that is not occupied by the light output aperture.

The illumination system 100 can achieve an enhanced maximum exiting radiance that is greater than the maximum intrinsic source radiance of the light source only if the total light output aperture area $A_O$ of the light output aperture 104 is less than the total light-emitting area $A_S$ of the light source. This area requirement for enhancing the maximum exiting radiance can be understood from the following theoretical examples. First assume that the inside surfaces of a theoretical illumination system have no absorption losses, i.e. areas $A_S$ and $A_R$ all have 100% reflectivity. Also assume that the light source emits light in a Lambertian distribution. Note that a Lambertian emitter is an emitter that has a constant radiance for all emitting angles from −90 degrees to +90 degrees.

If the light output area $A_O$ is equal to the total light-emitting area $A_S$, then all the light flux emitted by the source will exit the theoretical illumination system in the same area and will have, in many cases, the same Lambertian distribution. The maximum exiting radiance of the light exiting the light output aperture will be equal to the maximum intrinsic source radiance.

If the light output area $A_O$ of the theoretical illumination system is larger than the total light-emitting area $A_S$, the light exiting the light output aperture can have the same Lambertian distribution but will have a maximum exiting radiance that is less than the maximum intrinsic source radiance due to the output light flux being spread over a larger area. The maximum exiting radiance directed from the light output aperture will be lower by a factor of $A_S/A_O$.

If the light output area $A_O$ of the theoretical illumination system is smaller than the total light-emitting area $A_S$ and no light is lost or absorbed inside the illumination system, the light exiting the light output area can have the same Lambertian distribution but will have a maximum exiting radiance that is greater than the maximum intrinsic source radiance due to the reduced area of the light output aperture. The maximum exiting radiance directed from the light output aperture will be greater by a factor of $A_S/A_O$. To achieve a maximum exiting radiance that is greater than the maximum intrinsic source radiance, it is therefore a requirement that the output area $A_O$ be less than the total light-emitting area $A_S$.

However, the area requirement that $A_O$ must be less than $A_S$ is not the only requirement needed in order to achieve an enhancement of the maximum exiting radiance in an illumination system. In a typical illumination system, the reflectivity $R_S$ and the reflectivity $R_E$ will be less than 100%, which will lower the exiting radiance enhancement. Light that does not exit the light output aperture 104 on the first attempt may be absorbed by the light source or the light-recycling envelope as it is reflected one or more times inside the light-recycling envelope. These losses will reduce the maximum exiting radiance. Therefore, in order to achieve an enhancement of the maximum exiting radiance in a typical illumination system, $R_S$ and $R_E$ must be relatively high even if they are not 100%. The preferred values for $R_S$ and $R_E$ were listed previously.

Furthermore, in a typical illumination system, the light source may not emit light in a wide Lambertian (−90 degrees to +90 degrees) angular distribution but in a narrower angular distribution. When a light source initially emits light in a narrow angular distribution and when the emitted light then undergoes multiple reflections inside the illumination system, the light exiting the light output aperture will have a wider angular distribution than the initial angular distribution. The output distribution will be approximately a Lambertian distribution. Expanding the original narrow angular distribution to a wider output distribution inside the illumination system also reduces the maximum exiting radiance of the light exiting the light output aperture. Therefore, in order to achieve an enhancement of the maximum exiting radiance in a typical illumination system, the angular distribution of the light emitted by the light source should be as close to a Lambertian distribution as possible.

The maximum theoretical radiance enhancement is given by the ratio of the areas $A_S/A_O$ as shown above. For example, if $A_S$ equals 20 mm$^2$ and $A_O$ equals 1 mm$^2$, then the maximum theoretical enhancement of the maximum exiting radiance is $A_S/A_O$ or 20. The maximum value is achieved only if the LED is a Lambertian emitter and only if $R_S$ and $R_E$ each equal 100%. If the LED is not a perfect Lambertian emitter or if $R_S$ and $R_E$ are each less than 100%, as is normally the case, then enhancement of the maximum exiting radiance can still be achieved but the enhancement will be less than the maximum theoretical value. In such cases, the area $A_O$ may need to be significantly less than $A_S$ in order to achieve a maximum exiting radiance that is greater than the maximum intrinsic source radiance. Preferably, the area $A_O$ of the light output aperture 104 is less than or equal to 50% of the total light-emitting area $A_S$ of the light source. More preferably, the area $A_O$ of the light output aperture 104 is less than or equal to 30% of the total light-emitting area $A_S$ of the light source. Most preferably, the area $A_O$ of the light output aperture 104 is less than or equal to 10% of the total light-emitting area $A_S$ of the light source. In addition, for some applications it is desirable that the area $A_O$ of the light output aperture 104 be small and comparable in size to the area of an arc lamp source. For those applications, preferably the area $A_O$ of the light output aperture 104 is less than 25 mm$^2$ in area. More preferably, the area $A_O$ of the light output aperture 104 is less than 10 mm$^2$.

Figure 4:
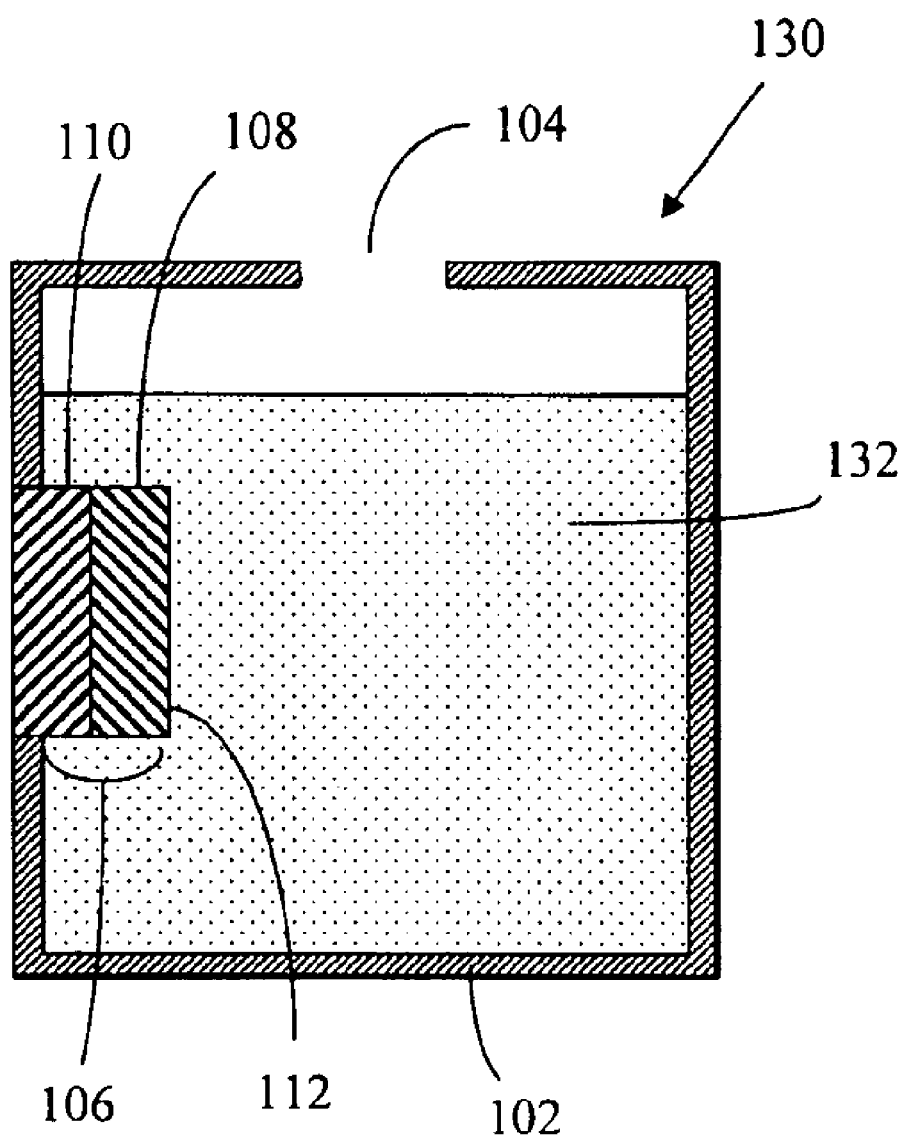
FIG. 4 is an embodiment of this invention in which the light-recycling envelope is partially filled with a light-transmitting solid.

Another embodiment of this invention is shown in cross-section in FIG. 4. Illumination system 130 is identical to illumination system 100 except that the interior volume of the light-recycling envelope 102 is substantially filled with a light-transmitting solid 132. Alternatively, light-transmitting solid 132 can partially fill or completely fill the light-recycling envelope.

Preferably the light-transmitting solid 132 is in contact with emitting layer 108 of LED 106. By placing a light-transmitting solid in contact with the emitting layer of an LED, the difference in refractive index between the emitting layer and the environment external to the emitting layer will be reduced relative to having air at the interface of the emitting layer. Reducing the refractive index difference reduces the amount of light that undergoes total internal reflection inside the emitting layer and increases the efficiency of light emission from the emitting layer. This effect can result in an overall increase in the efficiency of the illumination system. The highest efficiency of light emission from the emitting layer will occur if the effective refractive index of the light-transmitting solid is equal to or greater than the refractive index of the emitting layer.

If necessary, the effective refractive index of the light-transmitting solid can be increased by incorporating ultrafine powders of high index materials into the light-transmitting solid. Preferably, the ultrafine powders are made from materials having a bulk index of refraction greater than 1.60. Ultrafine powders are powders with particle sizes less than about 300 nanometers. Exemplary ultrafine powders can be made from materials such as, for example, tin oxide, titanium oxide, zinc oxide, cerium oxide and antimony pentoxide.

Figure 5:
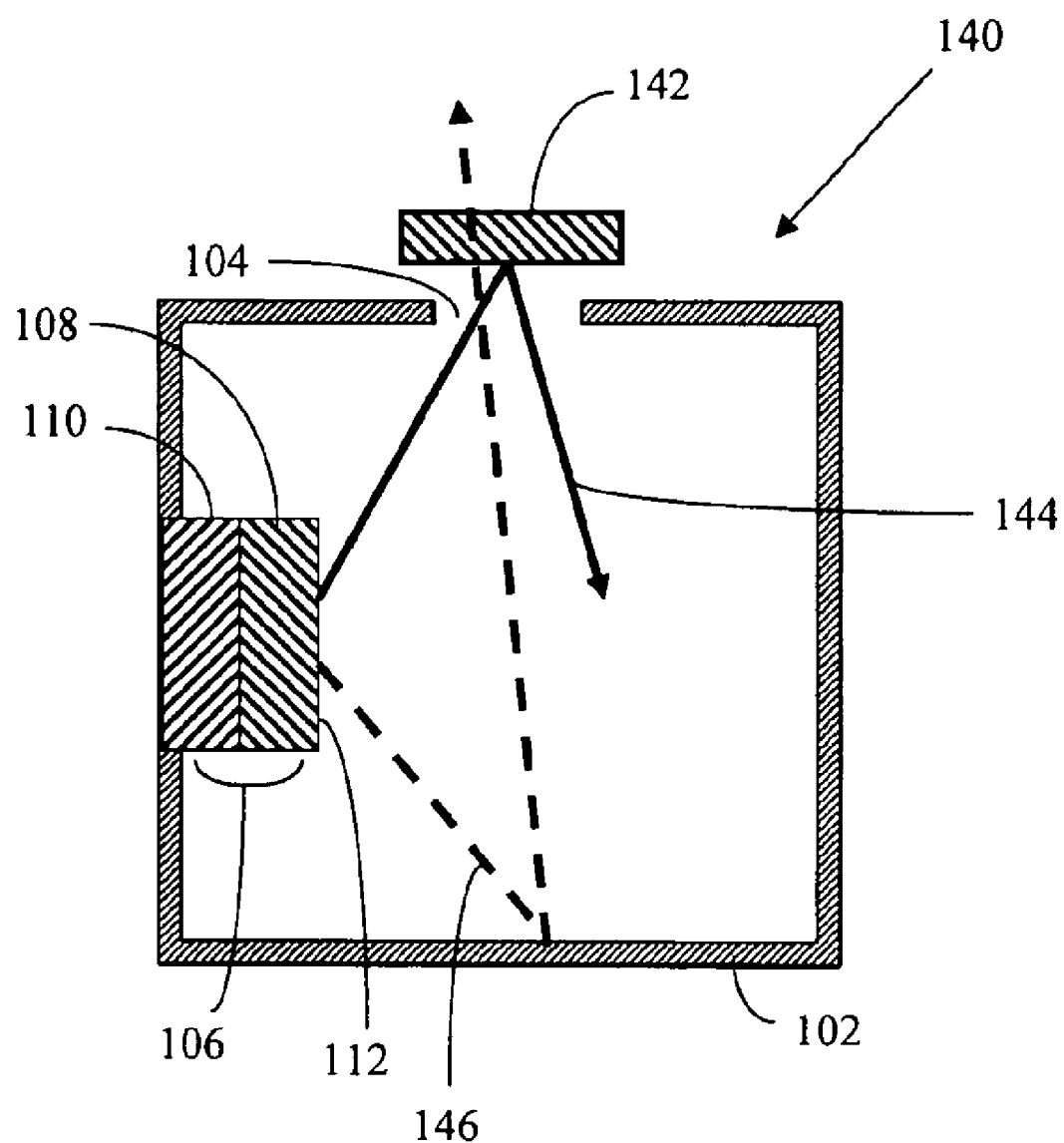
FIG. 5 is an embodiment of this invention that further comprises a planar reflecting polarizer.

Another embodiment of this invention is illumination system 140 shown in cross-section in FIG. 5. Illumination system 140 is identical to illumination system 100 except that illumination system 140 further comprises a planar reflective polarizer 142.

A planar reflective polarizer is a polarizer that reflects light of a first polarization state and transmits light of a second polarization state. Polarization states can be states of linear polarization or states of circular polarization. Examples of suitable planar reflective polarizers are Vikuiti™ Dual Brightness Enhancement Film (DBEF) made by 3M Corporation and polarizers made by NanoOpto Corporation and Moxtek Incorporated that utilize subwavelength optical elements.

The planar reflective polarizer 142 is placed adjacent to the light output aperture 104 and placed in the optical path of light exiting from the light output aperture 104. The adjacent position of the planar reflective polarizer can be either just outside the light-recycling envelope or just inside the light-recycling envelope. The planar reflective polarizer reflects light of any wavelength that has a first polarization state. Also, the planar reflective polarizer transmits light of any wavelength that has a second polarization state. The light of a first polarization state is recycled back into the light-recycling envelope. The light of a first polarization state recycled back into the light-recycling envelope will, after multiple reflections, be converted into a mixture of light of a first polarization state and light of a second polarization state. The converted light of a second polarization state will then be able to pass through the planar reflective polarizer. If only the second polarization state is desired for the output of illumination system 140, recycling the first polarization state back into the light-reflecting envelope to be converted to light of a second polarization state will improve the overall efficiency and the maximum exiting radiance of illumination system 140.

Some illumination system applications require polarized light. For example, illumination systems utilized for flat-panel display or projection display applications that incorporate liquid crystal display (LCD) panels or liquid-crystal-on-silicon (LCOS) display panels require illumination systems that emit polarized light.

Light rays 144 and 146 in FIG. 5 illustrate the function of the planar reflective polarizer. Light ray 144 of a first polarization state is emitted from surface 112 of emitting layer 108 on the fourth side of the illumination system 140, passes through the interior of the light-recycling envelope 102 and passes through the light output aperture 104 a first time to reach the planar reflective polarizer 142. Light ray 144 is reflected by the planar reflective polarizer 142, passes through the light output aperture 104 a second time and is recycled back into the interior of the light-recycling envelope 102.

Light ray 146 of a second polarization state is emitted from surface 112 of emitting layer 108 on the fourth side of the illumination system 140, passes through the interior of the light-recycling envelope 102 to the inside surface of the light-recycling envelope 102 on the third side. Light ray 146 is reflected by the light-recycling envelope 102, passes through the interior of the light-recycling envelope 102, passes through the light output aperture 104 on the first side and passes through the planar reflective polarizer 142. Overall, the planar reflective polarizer reflects light of a first polarization state and transmits light of a second polarization state.

Figure 6A:
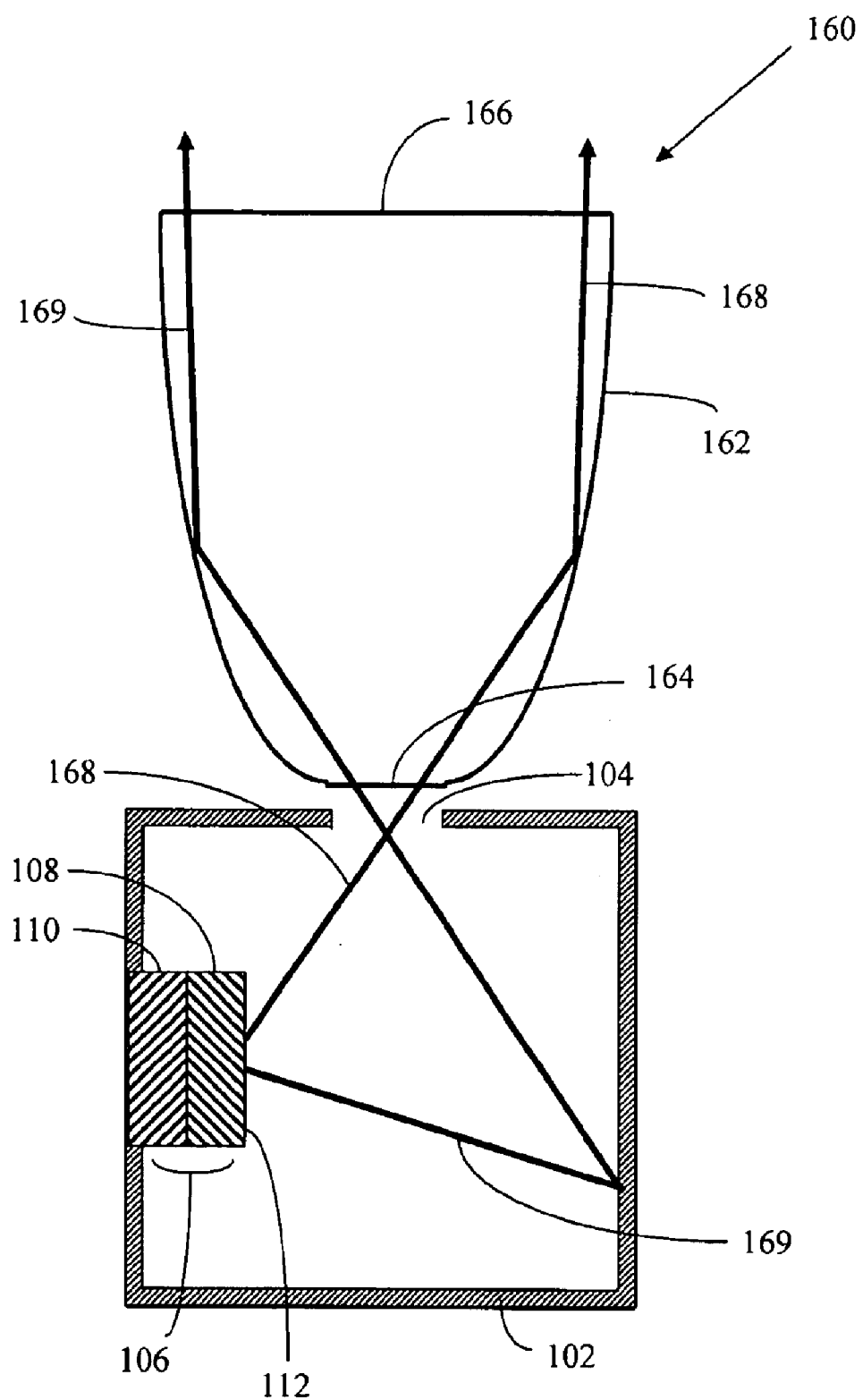
FIGS. 6A, 6B and 6C are embodiments of this invention that further comprise light-collimating elements.
Figure 6B:
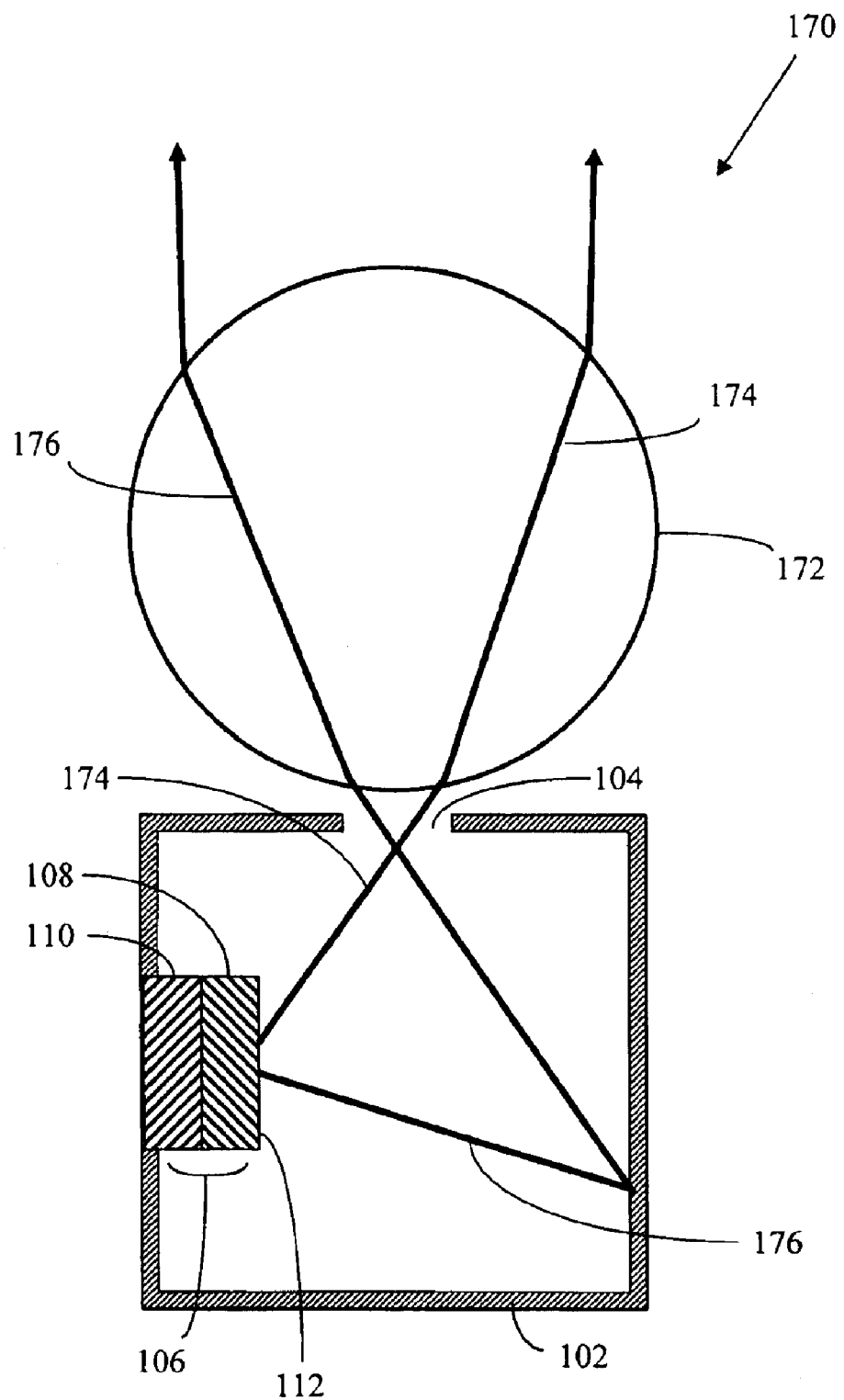
Figure 6C:
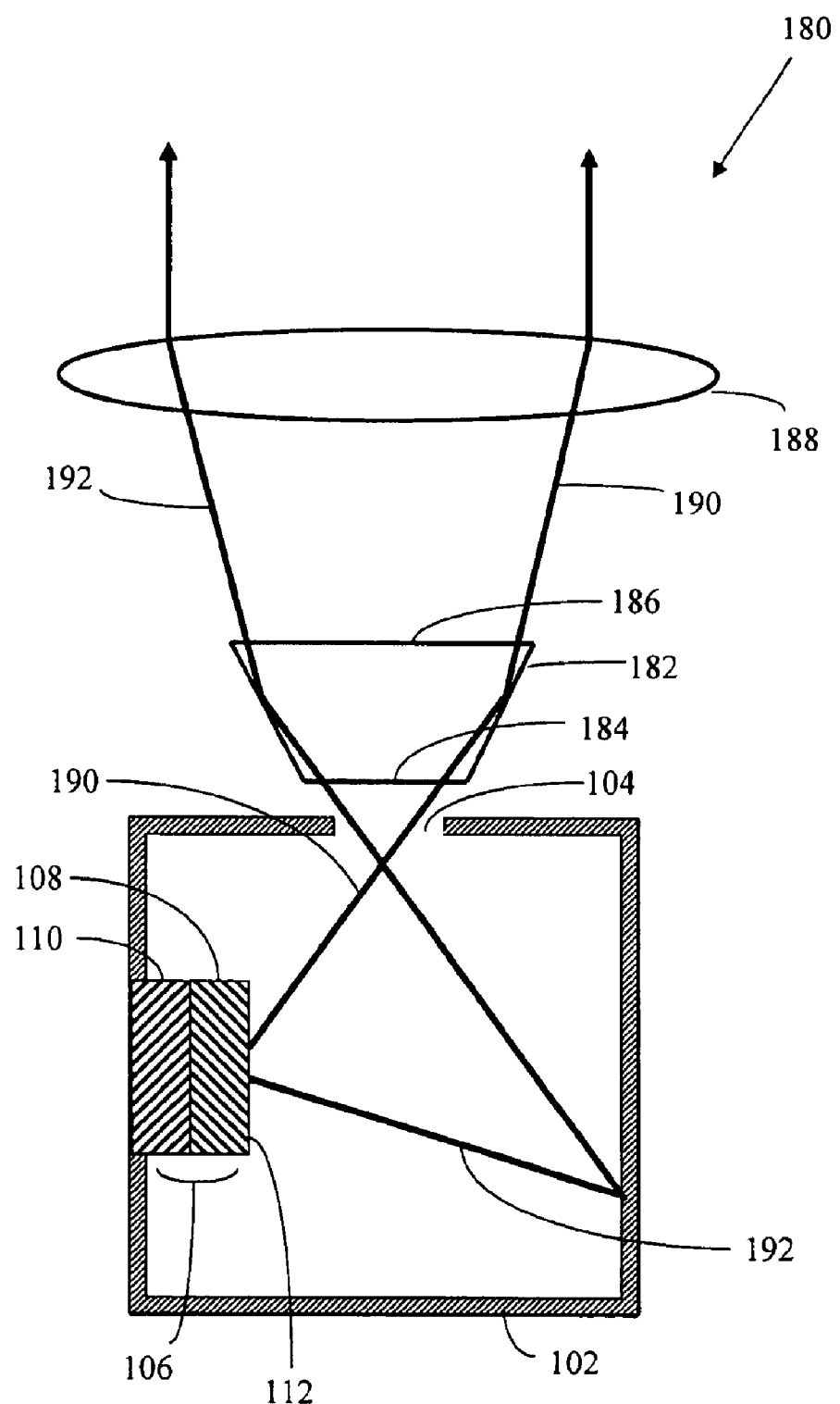

Other embodiments of this invention are partially collimating illumination systems. FIGS. 6A, 6B and 6C are cross-sectional views of illuminations systems that utilize light-collimating elements to partially collimate the output light. In general, a light-collimating element can be any optical element that at least partially collimates the light exiting from the light output aperture 104. For example, the light-collimating element can be a compound parabolic reflector, a convex lens, a tapered light guide, or a combination of two or more such elements Illumination system 160 in FIG. 6A is identical to illumination system 100 except that illumination system 160 further comprises a light-collimating element 162. In FIG. 6A, light-collimating element 162 is a compound parabolic reflector for illustrative purposes. A compound parabolic reflector is a tapered light guide that transports light by reflecting light from the inside surfaces of the tapered light guide. The compound parabolic reflector may be constructed from a solid transparent material. If the compound parabolic reflector is constructed from such a solid transparent material, light can pass through the material and reflect from the inside surfaces of the compound parabolic reflector by total internal reflection. Alternatively, the compound parabolic reflector may be a hollow structure and the sides of the compound parabolic reflector must then be covered with a reflective coating in order to reflect light. Light-collimating element 162 has an input surface 164, which is adjacent to the light output aperture 104 and which accepts uncollimated light, and an output surface 166. The input surface 164 accepts uncollimated light from the light output aperture 104. The light-collimating element 162 partially collimates the previously uncollimated light and transmits the partially collimated light through the output surface 166. In order for the light-collimating element to partially collimate the light exiting the light output aperture 104, the area of input surface 164 must be less than the area of the output surface 166. Equation 5 gives the mathematical relationship between the input and output areas and the input and output solid angle distributions of the light.

Representative light rays 168 and 169 shown in FIG. 6A illustrate the function of the light-collimating element 162 when light-collimating element 162 is a compound parabolic reflector. Light ray 168 is emitted from surface 112 of emitting layer 108 on the first side, passes through the interior of the light-recycling envelope 102, passes through the light output aperture 104 on the first side and passes through input surface 164 of the compound parabolic reflector as uncollimated light. Light ray 168 is reflected by the sides of the compound parabolic reflector and exits the compound parabolic reflector through output surface 166 as partially collimated light.

Light ray 169 is emitted from surface 112 of emitting layer 108 on the fourth side, passes through the interior of light-recycling envelope 102 to the inside surface of the light-recycling envelope 102 on the second side. Light ray 169 is reflected by the light-recycling envelope 102, passes through the interior of the light-recycling envelope 102, passes through the light output aperture 104 on the first side and enters the compound parabolic reflector through input surface 164. Light ray 169 is reflected by the sides of the compound parabolic reflector and exits the compound parabolic reflector through output surface 166 as partially collimated light.

The degree of light collimation required from the light-collimating element depends on the application. The light that exits through the light output aperture 104 typically has a Lambertian (output angles of −90 degrees to +90 degrees or a solid angle of $2\pi$) or near Lambertian angular distribution. The collimation of light exiting the light-collimating element 162 can be adjusted as needed by changing the area of the output surface 166 relative to the area of the input surface 164 utilizing the mathematical relationship of Equation 5. If the input refractive index $n_{in}$ of the light-collimating element is equal to the output refractive index $n_{out}$ of the light-collimating element, then Equation 4 can be used instead and the light output solid angle distribution $\Omega_{out}$ from the light-collimating element is given by $$\Omega_{out} = \Omega_{in}(Area_{in})/(Area_{out}), \qquad \text{[Equation 6]}$$

where $\Omega_{in}$ is the light input solid angle distribution into the light-collimating element, $Area_{in}$ is the area of the input surface 164 and $Area_{out}$ is the area of the output surface 166.

For applications requiring a high degree of light collimation, the light-collimating element 162 partially collimates the light so that the light output distribution is preferably within the angular range of −30 degrees to +30 degrees. More preferably, light-collimating element 162 partially collimates the light so that the light output distribution is within the angular range of −20 degrees to +20 degrees. Most preferably, light-collimating element 162 partially collimates the light so that the light output distribution is within the angular range of −10 degrees to +10 degrees.

Another example of an illumination system that partially collimates the light output is illumination system 170 shown in cross-section in FIG. 6B. Illumination system 170 is identical to illumination system 100 except that illumination system 170 further comprises a light-collimating element 172, in this case a convex lens that is a spherical ball lens, to partially collimate the light exiting the light output aperture 104. The light input side of the light-collimating element 172 is adjacent to the light output aperture 104. The output side of the light-collimating element 172 is opposite to the input side. In order to partially collimate the light passing through the light-collimating element 172, the area of the light beam on the output side of the lens must be larger than the area of the beam on the input side.

Representative light rays 174 and 176 shown in FIG. 6B illustrate the function of the light-collimating element 172 when light-collimating element 172 is a convex lens. Light ray 174 is emitted from surface 112 of emitting layer 108 on the first side, passes through the interior of the light-recycling envelope 102, passes through the light output aperture 104 on the first side and passes through the input side of the light-collimating element 172 as uncollimated light. Light ray 174 is refracted by the light-collimating element 172 and exits through the output side of light-collimating element 172 as partially collimated light.

Light ray 176 is emitted from surface 112 of emitting layer 108 on the fourth side, passes through the interior of light-recycling envelope 102 to the inside surface of the light-recycling envelope 102 on the second side. Light ray 176 is reflected by the light-recycling envelope 102, passes through the interior of the light-recycling envelope 102, passes through the light output aperture 104 on the first side and enters the input side of light-collimating element 172 as uncollimated light. Light ray 176 is refracted by the light-collimating element 172 and exits through the output side of light-collimating element 172 as partially collimated light.

Preferably, the light-collimating element 172 partially collimates the light exiting the light-collimating element so that the light output distribution is within the angular range of −30 degrees to +30 degrees. More preferably, the light output distribution is within the angular range of −20 degrees to +20 degrees. Most preferably, the light output distribution is within the angular range of −10 degrees to +10 degrees.

Another example of an illumination system that partially collimates the light output is illumination system 180 shown in cross-section in FIG. 6C. Illumination system 180 is identical to illumination system 100 except that illumination system 180 further comprises a first light-collimating element 182, a tapered light guide, and a second light-collimating element 188, a convex lens, that operate in combination to partially collimate the light exiting the light output aperture 104.

The first light-collimating element 182 in FIG. 6C is a tapered light guide that has an input surface 184 and an output surface 186. The sides of the tapered light guide are reflective, either by utilizing total internal reflection or because a reflective coating has been applied to the sides, but not the input and output surfaces, of the light-collimating element 182. In order for the light-collimating element 182 to partially collimate light, the area of the output surface 186 must be larger than the area of the input surface 184. Equation 6, the same equation that was used when the light-collimating element was a compound parabolic reflector, determines the degree of partial collimation that can be achieved by the first light-collimating element 182.

The second light-collimating element 188 is a convex lens. If the area of the convex lens is larger than the area of the output surface 186 of the first light-collimating element 182 and, in addition, the focal length of the convex lens is properly chosen, then the second light-collimating element 188 will further improve the partial light collimation that was achieved with the first light-collimating element 182 acting alone.

Representative light rays 190 and 192 shown in FIG. 6C illustrate the function of the first light-collimating element 182 and the second light-collimating element 188. Light ray 190 is emitted from surface 112 of emitting layer 108 on the first side, passes through the interior of the light-recycling envelope 102, passes through the light output aperture 104 on the first side and passes through input surface 184 of the first light-collimating element 182 as uncollimated light. Light ray 190 is reflected by the sides of the first light-collimating element 182 and exits through the output surface 186 of the first light-collimating element 182 as partially collimated light. The light ray 190 then passes through and is refracted by the second light-collimating element 188 and finally exits the second light-collimating element 188 with further improved partial collimation.

Light ray 192 is emitted from surface 112 of emitting layer 108 on the fourth side, passes through the interior of light-recycling envelope 102 to the inside surface of the light-recycling envelope 102 on the second side. Light ray 192 is reflected by the light-recycling envelope 102, passes through the interior of the light-recycling envelope 102, passes through the light output aperture 104 on the first side and enters the input surface 184 of the first light-collimating element 182 as uncollimated light. Light ray 192 is reflected by the sides of the first light-collimating element 182 and exits through the output surface 186 of the first light-collimating element 182 as partially collimated light. The light ray 192 then passes through and is refracted by the second light-collimating element 188 and finally exits the second light-collimating element 188 with further improved partial collimation.

Preferably, the first light-collimating element 182 and the second light-collimating element 188 operating in combination partially collimate the light exiting the second light-collimating element 188 so that the light output distribution is within the angular range of −30 degrees to +30 degrees. More preferably, the light output distribution is within the angular range of −20 degrees to +20 degrees. Most preferably, the light output distribution is within the angular range of −10 degrees to +10 degrees.

Figure 7A:
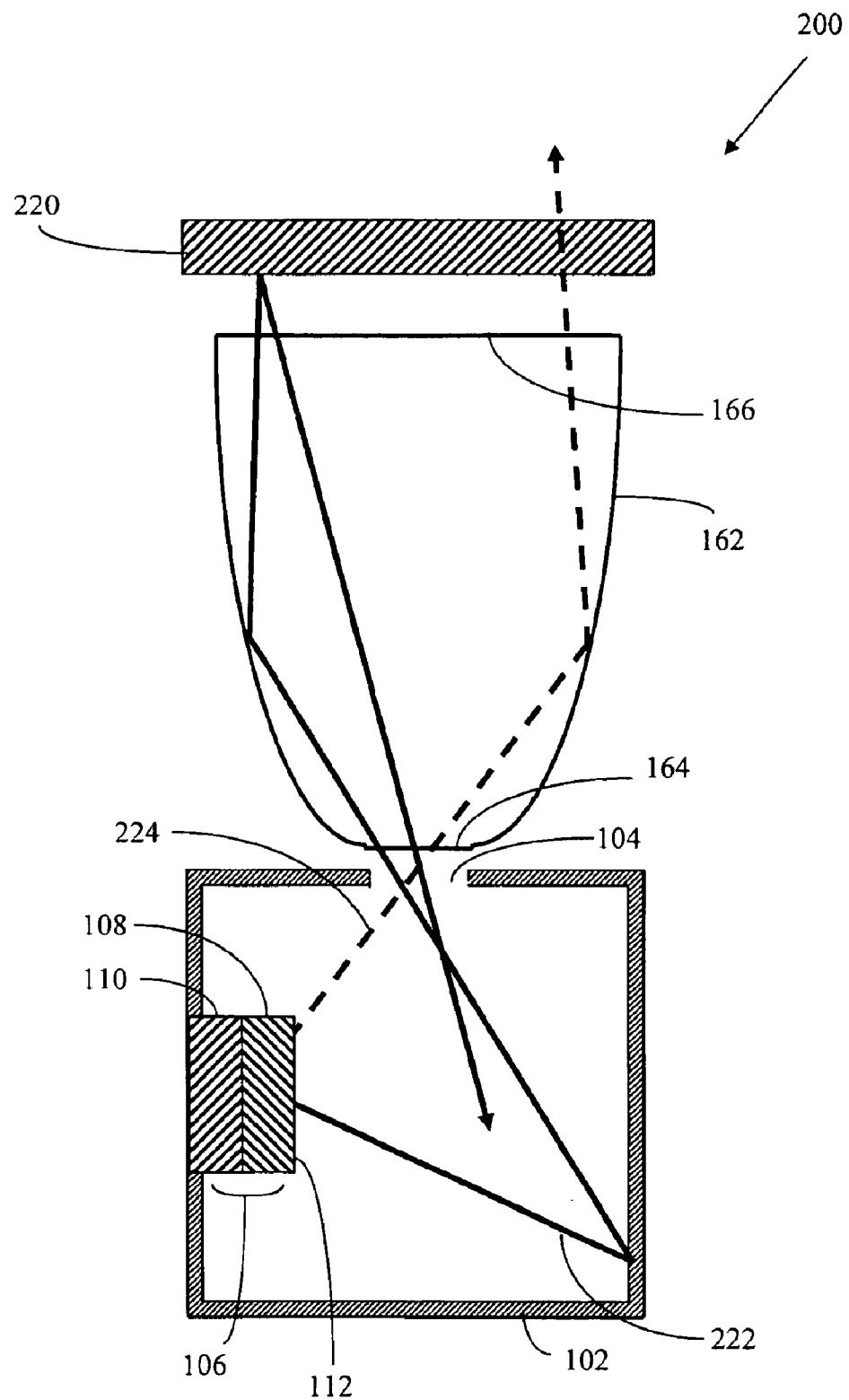
FIG. 7A is an embodiment of this invention that further comprises both a light-collimating element and a planar reflective polarizer.
Figure 7B:
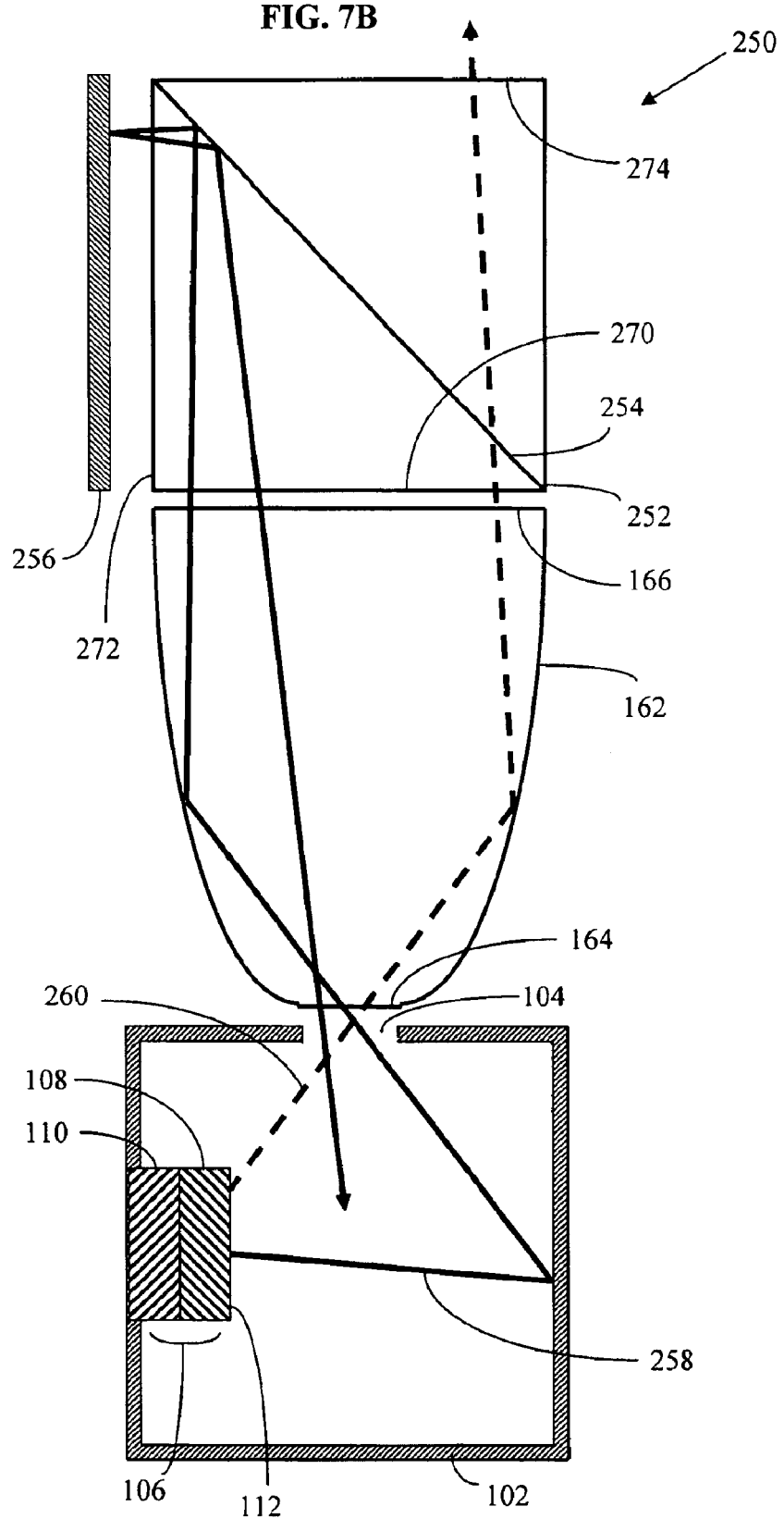
FIG. 7B is an embodiment of this invention that further comprises both a light-collimating element and a beam-splitting prism polarizer.

In the previous embodiments, FIG. 5 illustrates an illumination system that incorporates a planar reflective polarizer. FIGS. 6A, 6B and 6C illustrate illumination systems that incorporate one or two light-collimating elements. It is also possible to have embodiments of this invention that comprise both a reflective polarizer and one or more light-collimating elements operating in combination. One example using a planar reflective polarizer is shown in FIG. 7A. FIG. 7B shows another embodiment of this invention that comprises both a light-collimating element and a different type of reflective polarizer.

FIG. 7A is a cross-sectional view of illumination system 200. Illumination system 200 is identical to illumination system 160 in FIG. 6A that has a light-collimating element, except that illumination system 200 further comprises a planar reflective polarizer 220. Examples of a planar reflective polarizer have been listed previously. The planar reflective polarizer 220 is positioned adjacent to the output surface 166 of light-collimating element 162. Planar reflective polarizer 220 reflects light of a first polarization state and transmits light of a second polarization state. Planar reflective polarizer 220 reflects and recycles light of the first polarization state back through the light-collimating element 162 and back into the light-recycling envelope 102. Light of a first polarization state that has been recycled back into the light-recycling envelope 102 can be reflected multiple times within the light-recycling envelope and thereby be partially converted into light of a second polarization state. Recycled light that has been converted into light of a second polarization state may then exit the light-recycling envelope through light output aperture 104, pass through light-collimating element 162 and finally pass through planar reflective polarizer 220. This recycled and polarization converted light adds to the light output of illumination system 200. The efficiency and the maximum exiting radiance of illumination system 200 are thereby increased.

Representative light rays 222 and 224 shown in FIG. 7 illustrate the function of the light-collimating element 162 and the planar reflective polarizer 220. Light ray 222 of a first polarization state is emitted from surface 112 of emitting layer 108 on the fourth side, passes through the interior of light-recycling envelope 102 to the inside surface of the light-recycling envelope 102 on the second side. Light ray 222 of a first polarization state is reflected by the light-recycling envelope 102, passes through the interior of the light-recycling envelope 102, passes through the light output aperture 104 on the first side and enters the input surface 164 of light-collimating element 162 as uncollimated light. Light ray 222 of a first polarization state is reflected by the sides of light-collimating element 162 and exits the light-collimating element through the output surface 166 as partially collimated light. The light ray 222 of a first polarization state is then reflected by planar reflecting polarizer 220, passes through light-collimating element 162 a second time and reenters the light-recycling envelope 102 to eventually be partially converted to light of a second polarization state.

Light ray 224 of a second polarization state is emitted from surface 112 of emitting layer 108 on the first side, passes through the interior of the light-recycling envelope 102, passes through the light output aperture 104 on the first side and passes through input surface 164 of the light-collimating element 162 as uncollimated light. Light ray 224 of a second polarization state is reflected by the sides of the light-collimating element 162 and then exits through the output surface 166 of the light-collimating element 162 as partially collimated light. The light ray 224 then passes through planar reflective polarizer 220 and exits illumination system 200 as partially collimated light of a second polarization state.

FIG. 7B is a cross-sectional view of illumination system 250. Illumination system 250 is identical to illumination system 160 that has a light-collimating element, except that illumination system 250 further comprises a reflective polarizer. In this illustration, the reflective polarizer is a beam-splitting prism polarizer 252. The characteristics and function of a beam-splitting prism polarizer are well known to those skilled in the art. The beam-splitting prism polarizer 252 has an input surface 270, a first output surface 272 perpendicular to the input surface, a second output surface 274 parallel and opposite to the input surface and a partially reflecting diagonal surface 254. The partially reflecting diagonal surface 254 located along a prism diagonal reflects light of a first polarization state to the first output surface and transmits light of a second polarization state to the second output surface.

The beam-splitting prism polarizer 252 is positioned adjacent to the output surface 166 of light-collimating element 162. The partially reflecting diagonal surface 254 of the beam-splitting prism polarizer 252 reflects light of a first polarization state to a reflector 256 and transmits light of a second polarization state. Reflector 256 reflects and recycles the light of a first polarization state back through the beam-splitting prism polarizer 252, back through the light-collimating element 162 and back into the light-recycling envelope 102. Light of a first polarization state that has been recycled back into the light-recycling envelope 102 can be reflected multiple times within the light-recycling envelope and thereby be partially converted to light of a second polarization state. Recycled light that has been converted into light of a second polarization state may then exit the light-cycling envelope through light output aperture 104, pass through light-collimating element 162 and finally pass through the second output surface 274 of beam-splitting prism polarizer 252. This recycled and polarization converted light adds to the light output of illumination system 250. The efficiency and the maximum exiting radiance of illumination system 250 are thereby increased.

Representative light rays 258 and 260 shown in FIG. 7B illustrate the function of the light-collimating element 162 and the beam-splitting prism polarizer 252. Light ray 258 of a first polarization state is emitted from surface 112 of emitting layer 108 on the fourth side, passes through the interior of light-recycling envelope 102 to the inside surface of the light-recycling envelope 102 on the second side. Light ray 258 of a first polarization state is reflected by the light-recycling envelope 102, passes through the interior of the light-recycling envelope 102, passes through the light output aperture 104 on the first side and enters the input surface 164 of light-collimating element 162 as uncollimated light. Light ray 258 of a first polarization state is reflected by the sides of light-collimating element 162 and exits the light-collimating element through the output surface 166 as partially collimated light. The light ray 258 of a first polarization state enters beam-splitting prism polarizer 252 through input surface 270, is reflected by partially reflecting diagonal surface 254, passes through first output surface 272 to reflector 256 and is reflected by reflector 256 backwards though the first output surface 272 of the beam-splitting prism polarizer. Light ray 258 is reflected by the partially reflecting diagonal surface 254 backwards through the input surface 270 and into the light-collimating element 162, passes through light-collimating element 162 a second time and reenters the light-recycling envelope 102 to eventually be partially converted into light of a second polarization state.

Light ray 260 of a second polarization state is emitted from surface 112 of emitting layer 108 on the first side, passes through the interior of the light-recycling envelope 102, passes through the light output aperture 104 on the first side and passes through input surface 164 of the light-collimating element 162 as uncollimated light. Light ray 260 of a second polarization state is reflected by the sides of the light-collimating element 162 and then exits through the output surface 166 of the light-collimating element 162 as partially collimated light. Light ray 260 passes through input surface 270 into the beam-splitting prism polarizer 252, passes through partially reflecting diagonal surface 254, exits the beam-splitting prism polarizer 252 through the second output surface 274 and exits and illumination system 250 as partially collimated light of a second polarization state.

Figure 8:
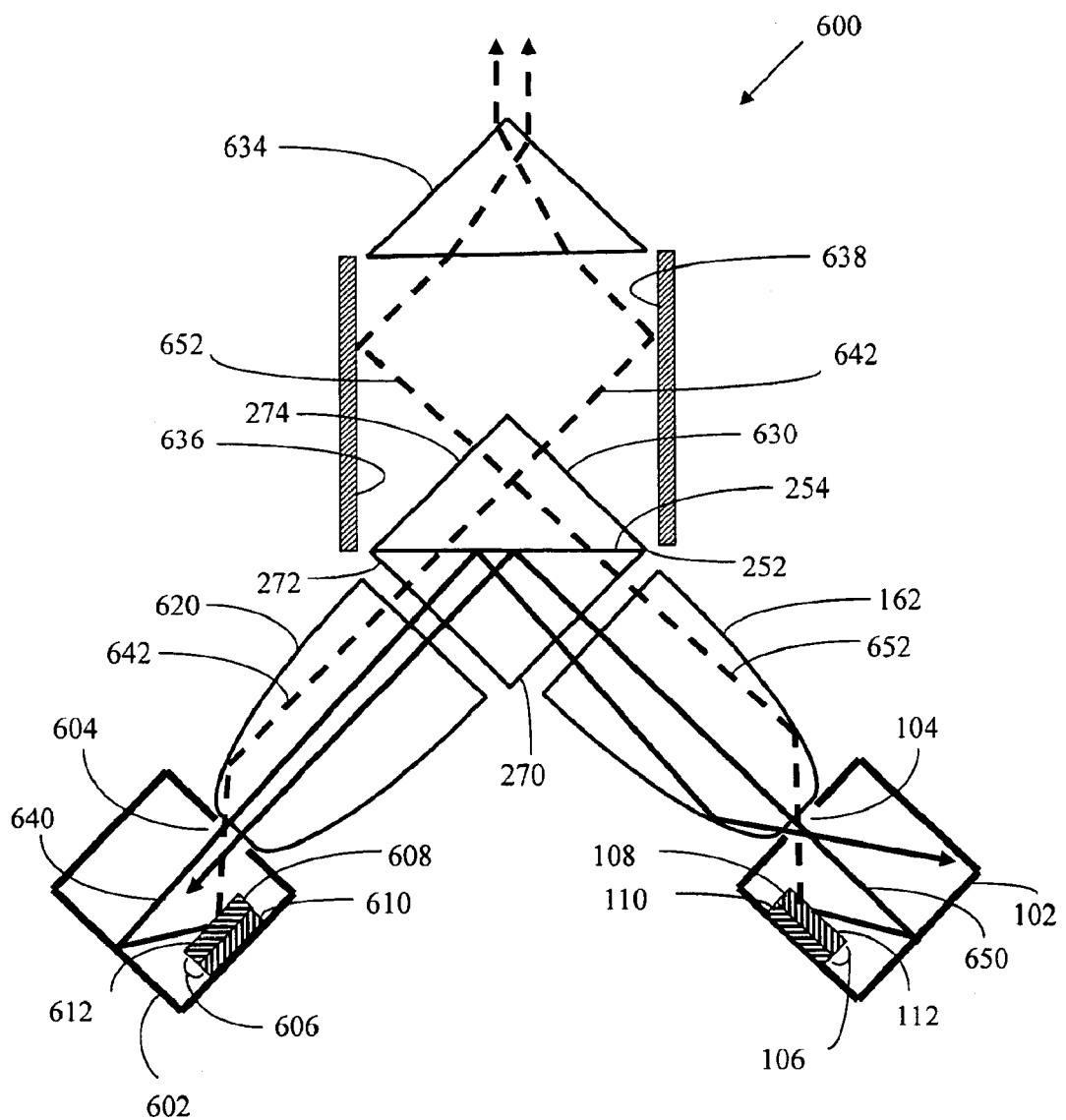
FIG. 8 is an embodiment of this invention that comprises two light sources, two light-recycling envelopes, two light-collimating elements and a beam-splitting prism polarizer.

In FIG. 7B, light of a first polarization state that is directed out of the first output surface 272 is reflected back into the beam-splitting prism polarizer 252 by reflector 256. An alternative illumination system 600 is shown in cross-section in FIG. 8. In FIG. 8, light of a first polarization state exiting the first output surface 272 is recycled into a second light-collimating element 620 and a second illumination system operating in combination. The second illumination system is comprised of a second LED 606, which has a second emitting layer 608 and a second reflecting layer 610, a second light-recycling envelope 602 and a second light output aperture 604. The second light-collimating element 620 has an input surface adjacent to the second light output aperture 604 and an output surface adjacent to the first output surface 272 of the beam-splitting prism polarizer 252.

Light of a first polarization state emitted by LED 106 is reflected by the partially reflecting diagonal surface 254 of beam-splitting prism polarizer 252 into the second light-collimating element 620 and the second light-recycling envelope 602 containing LED 606. Conversely, light of a first polarization state emitted by LED 606 is reflected by the partially reflecting diagonal surface 254 of beam-splitting prism polarizer 252 into the light-collimating element 162 and the light-recycling envelope 102 containing LED 106.

Light of a second polarization state emitted by LED 106 is transmitted by the partially reflecting diagonal surface 254 of beam-splitting prism polarizer 252. The light passes through surface 274, is reflected by reflector 636, is refracted by right-angle prism 634 and exits illumination system 600 as light of a second polarization state. Light of a second polarization state emitted by LED 606 is transmitted by the partially reflecting diagonal surface 254 of beam-splitting prism polarizer 252. The light passes through surface 630, is reflected by reflector 638, is refracted by right-angle prism 634 and exits illumination system 600 as light, of a second polarization state. The light of a second polarization state emitted from LED 106 and from LED 606 is combined to give an illumination system with improved maximum exiting radiance. The maximum exiting radiance of illumination system 600, comprising two light-recycling envelopes and two light-collimating elements, is greater than the maximum exiting radiance of illumination system 250, comprising one light-recycling envelope and one light-collimating element.

Light rays 640, 642, 650 and 652 illustrate the operation of illumination system 600. Light ray 640 of a first polarization state is emitted from surface 612 of emitting layer 608 of LED 606, passes through the interior of the light-recycling envelope 602 and is reflected by light-recycling envelope 602. Light ray 640 passes through the interior of light-recycling envelope 602, exits through light output aperture 604 and enters the input surface of light-collimating element 620. Light ray 640 passes through light-collimating element 620 without reflection and enters surface 272 of beam-splitting prism polarizer 252. Light ray 640 of a first polarization state is reflected by the partially reflecting diagonal surface 254 into light-collimating element 162. Light ray 640 reflects from the side of light-collimating element 162, exits the light-collimating element 162 and enters the light-recycling envelope 102 as recycled light.

Light ray 642 of a second polarization state is emitted from surface 612 of emitting layer 608, passes through the interior of the light-recycling envelope 602, exits through light output aperture 604 and enters the input surface of light-collimating element 620. Light ray 642 is reflected by the sides of light-collimating element 620, exits light-collimating element 620 and enters surface 272 of beam-splitting prism polarizer 252. Light ray 642 of a second polarization state passes through the partially reflecting diagonal surface 254 without reflection and exits the beam-splitting prism polarizer 252 through surface 630. Light ray 642 is reflected by reflector 638, is refracted by right-angle prism 634 and exits illumination system 600 as light of a second polarization state.

Light ray 650 of a first polarization state is emitted from surface 112 of emitting layer 108 of LED 106, passes through the interior of the light-recycling envelope 102 and is reflected by light-recycling envelope 102. Light ray 650 passes through the interior of light-recycling envelope 102, exits through light output aperture 104 and enters the input surface of light-collimating element 162. Light ray 650 passes through light-collimating element 162 without reflection and enters surface 270 of beam-splitting prism polarizer 252. Light ray 650 of a first polarization state is reflected by the partially reflecting diagonal surface 254 into light-collimating element 620. Light ray 650 passes through light-collimating element 620 without reflection, exits the light-collimating element 620 and enters the light-recycling envelope 602 as recycled light.

Light ray 652 of a second polarization state is emitted from surface 112 of emitting layer 108, passes through the interior of the light-recycling envelope 102, exits through light output aperture 104 and enters the input surface of light-collimating element 162. Light ray 652 is reflected by the sides of light-collimating element 162, exits light-collimating element 162 and enters surface 270 of beam-splitting prism polarizer 252. Light ray 652 of a second polarization state passes through the partially reflecting diagonal surface 254 without reflection and exits the beam-splitting prism polarizer 252 through surface 274. Light ray 652 is reflected by reflector 636, is refracted by right-angle prism 634 and exits illumination system 600 as light of a second polarization state.

In FIGS. 3–8, the light source is positioned inside the light-recycling envelope and the light-recycling envelope encloses the light source. It is also within the scope of this invention that a part of the light source may be located outside the light-recycling envelope. In such cases, the light-recycling envelope partially encloses the light source but does not enclose the entire light source. An example of an illumination system 300 where a part of the light source is located outside the light-recycling envelope is shown in the cross-sectional views in FIGS. 9A and 9B.

Figure 9A:
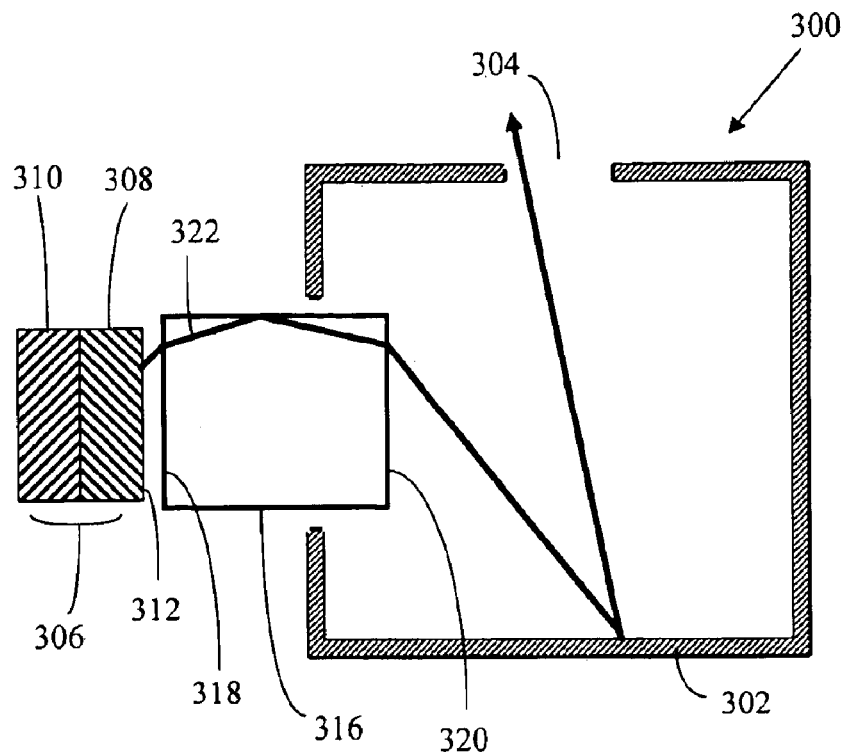
FIGS. 9A and 9B illustrate an embodiment of this invention that further comprises a light guide.
Figure 9B:
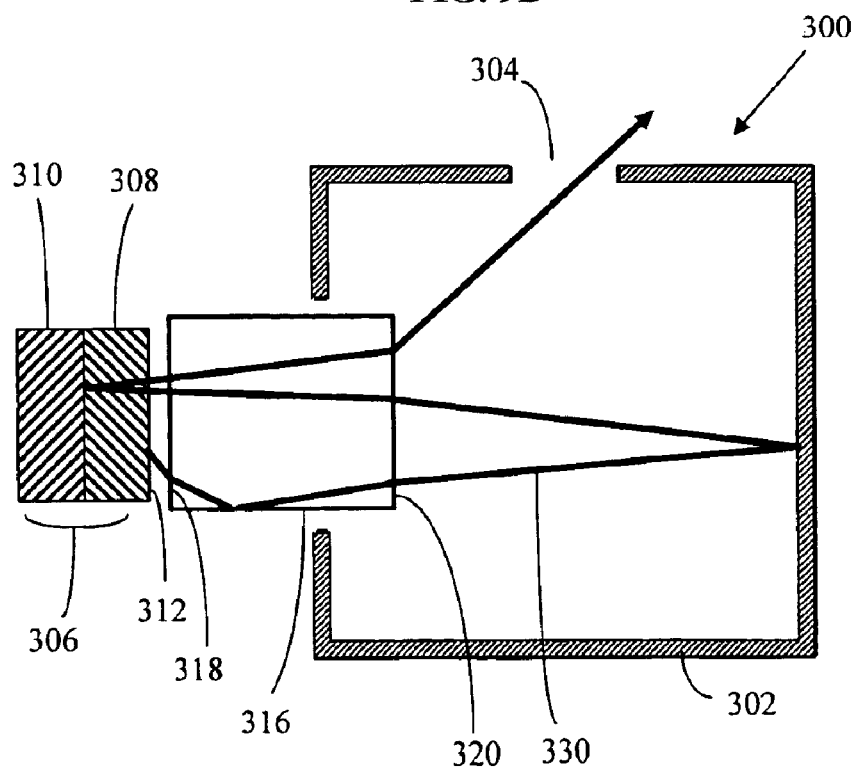

The cross-section of the illumination system 300 shown in FIGS. 9A and 9B has a first side, a second side, a third side and a fourth side. Illumination system 300 is similar to illumination system 100 except that the light source for illumination system 300 further comprises a light guide 316 in addition to an LED 306. Both the LED 306 and the light guide 316 are located on the fourth side. LED 306 is located outside the light-recycling envelope. Illumination system 300 also comprises a light-recycling envelope 302 and a light output aperture 304 located on the first side of the illumination system. The characteristics and properties of LED 306, the light-recycling envelope 302 and the light output aperture 304 are identical to the characteristics and properties of the respective elements in illumination system 100.

LED 306 has a maximum intrinsic source radiance that is determined by measuring an identically constructed LED that is not associated with a light guide and with a light-recycling envelope.

Light guide 316 is located on the fourth side of the illumination system and has an input surface 318 adjacent to surface 312 of emitting layer 308 of LED 306 and an output surface 320 located inside the light-recycling envelope 302. Preferably the area of the input surface 318 is greater than the area of surface 312 of the LED 306 so that substantially all of the light emitted through the surface 312 of LED 306 will enter light guide 316. Preferably there is gap between surface 312 of LED 306 and input surface 318 of light guide 316 and preferably the refractive index of the gap is less than the refractive index of the light guide. If such a gap exits and the gap has a refractive index sufficiently smaller than the refractive index of the light guide, light emitted from surface 312 at large angles, i.e. angles greater than about 45 degrees from the direction perpendicular to surface 312, will still be accepted into light guide 316, will be guided by the light guide at angles less than about 45 degrees to the direction perpendicular to surface 318 and will be directed into the light-recycling envelope. Conversely, if no gap exits between surface 312 and surface 318, light emitted from surface 312 at angles greater than about 45 degrees from the direction perpendicular to surface 312 probably will not be guided by light guide 316 into the light-recycling envelope 302 and probably will be lost.

Light guide 316 transports light emitted by emitting layer 308 of LED 306 from LED 306 into the light-recycling envelope 302. In addition, light guide 316 transports part of the light that is in the light-recycling envelope 302 back to the reflecting layer 310 of LED 306 as recycled light. And finally, light guide 316 transports the recycled light reflected by the reflecting layer 310 back into the light-recycling envelope. Recycled light reflected from reflecting layer 310 will increase the effective brightness of LED 306.

The total light-emitting area of LED 306 is area $A_S$. $A_S$ previously discussed, the reflectivity $R_S$ of the reflecting layer 310 is preferably at least 50%. More preferably, the reflectivity $R_S$ is at least 70%. Most preferably, the reflectivity $R_S$ is at least 90%. Also noted previously, the reflectivity $R_E$ of the light-recycling envelope 302 is preferably at least 50%. More preferably, the reflectivity $R_E$ is at least 70%. Most preferably, the reflectivity $R_E$ is at least 90%. The total output aperture area of output aperture 304 is area $A_O$. In illumination system 300, when $A_O$ is less than $A_S$ and when $R_S$ and $R_E$ are each greater than 50%, it is possible for the maximum exiting radiance of illumination system 300 to be greater than the maximum intrinsic source radiance of LED 306.

Example rays 322 and 330 in FIGS. 9A and 9B illustrate the function of light guide 316. Light ray 322 is emitted through surface 312 of emitting layer 308 of LED 306. Light ray 322 passes through the gap between surface 312 and 318 and enters light guide 316 through surface 318. Light ray 322 passes through light guide 316, reflecting from a side of light guide 316, and exits light guide 316 through surface 320, which is located inside the light-recycling envelope 302. Light ray 322 passes through the interior of light-recycling envelope 302 to the light-recycling envelope 302, is reflected by the light-recycling envelope, passes through the interior of the light-recycling envelope and exits illumination system 300 through light output aperture 304.

In FIG. 9B, light ray 330 is emitted through surface 312 of emitting layer 308 of LED 306 in a first time period. Light ray 330 passes through the gap between surface 312 and 318 and enters light guide 316 through surface 318. Light ray 330 passes through light guide 316, reflecting from the side of light guide 316, and exits light guide 316 through surface 320, which is located inside light-recycling envelope 302. Light ray 330 passes through the interior of light-recycling envelope 302 and is reflected and recycled back to the light source by the light-recycling envelope on the second side. Light ray 330 passes through the interior of light-recycling envelope 302 to surface 320 of light guide 316. Light ray 330 passes through light guide 316 without reflection, passes through surface 318 of light guide 316, passes through surface 312 and emitting layer 308 a first time, is reflected by reflecting layer 310 and passes through emitting layer 308 and surface 312 a second time and in a second time period. Light ray 330 re-enters light guide 316 through surface 318, passes through light guide 316 without reflection, and exits light guide 316 through surface 320. Light ray 330 then passes through the interior of the light-recycling envelope and exits illumination system 300 through light output aperture 304.

When light ray 330 passes through surface 312 of emitting layer 308 a second time and in a second time period, light 330 adds to light concurrently being emitted by emitting layer 308 of LED 306 in the second time period. Light ray 330 increases the effective radiance of LED 306 and increases the maximum exiting radiance of illumination system 300.

The light guide 316 may be constructed from any solid material that is transparent to light and that transports light by total internal reflection. Possible materials include inorganic glasses such as silicon dioxide and plastics such as polymethymethacrylate and fluoroacrylates. If LED 306 emits light in a Lambertian or near-Lambertian output angular distribution, a light guide 316 that guides light by total internal reflection may need to be a straight light guide in order to prevent light leakage from the sides of the light guide. The light guide 316 may also be a solid or hollow structure where the sides, but not the ends, of the light guide are coated with a light-reflecting material. If the sides of the light guide 316 are coated with a reflective material, the light guide 316 may also be a curved light guide and still efficiently transport light emitted by a Lambertian emitter.

Figure 10A:
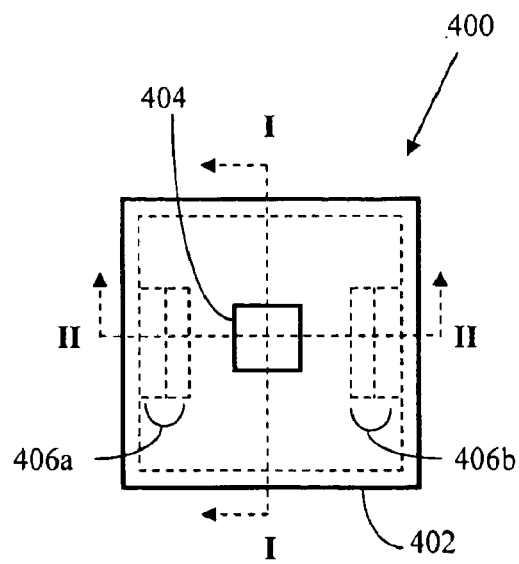
FIGS. 10A, 10B and 10C illustrate an embodiment of this invention that has two light-emitting diodes.
Figure 10B:
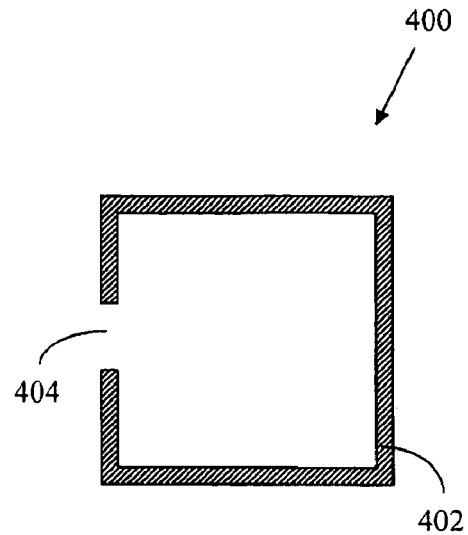
Figure 10C:
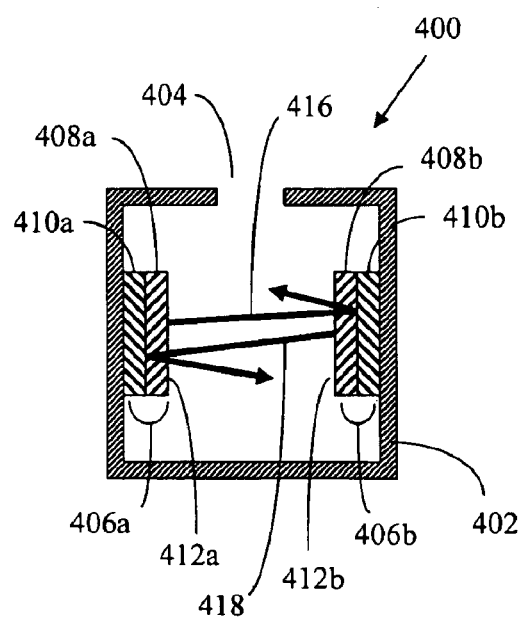

The embodiments of this invention illustrated in FIGS. 3–9 are illustrated with one LED as the light source. However, embodiments of this invention may incorporate more than one LED. FIGS. 10A, 10B and 10C illustrate an illumination system 400 that has a light source consisting of two LEDs, LED 406a and LED 406b, which both emit and reflect light. FIG. 10A is a top external view of illumination system 400 showing the edge of light-recycling envelope 402 and the light output aperture 404 as solid lines in the figure. FIG. 10B is a cross-section viewed along the I—I plane indicated in FIG. 10A. FIG. 10C is a cross-section viewed along the II—II plane indicated in FIG. 10A. The characteristics and properties of the elements LED 406a, LED 406b, the light-recycling envelope 402 and the light output aperture 404 are identical to the characteristics and properties of the respective elements in illumination system 100. As stated previously, the light-recycling envelope may have any three-dimensional shape that encloses an interior volume. Preferably the three-dimensional shape of the light-recycling envelope is a facetted surface with flat sides in order to facilitate the attachment of LEDs to the inside surfaces of the envelope. The cubical shape of illumination system 400 is for illustration purposes only.

The square cross-sectional shape of illumination system 400 shown in FIG. 10C has a first side containing the light output aperture 404, a second side, a third side and a fourth side. The first side is opposite and parallel to the third side. The second side is opposite and parallel to the fourth side. The first side and third side are perpendicular to the second side and fourth side. The four sides of the illumination system shown in cross-section in FIG. 10C plus the two remaining sides (not shown in FIG. 10C) of the six-sided cube form the interior of the light-recycling envelope.

Illumination system 400 has an LED 406a on the fourth side and an LED 406b on the second side. The two LEDs may emit light in the same wavelength range or the two LEDs may emit light in different wavelength ranges. For example, LED 406a may emit a first light flux of a first wavelength range. LED 406b may concurrently emit a second light flux of a second wavelength range, different than the first wavelength range. A fraction of the first light flux of a first wavelength range and a fraction of the second light flux of a second wavelength range exit the light output aperture 404 as light of a composite color. If the first light flux of a first wavelength range is held constant and the second light flux of a second wavelength range is changed by changing the electrical power driving LED 406b, the composite color exiting the light output aperture 404 will change.

If the composite color exiting the light output aperture 404 is white light, the quality of the white light can be changed by varying the ratio of the first light flux of a first wavelength range to the second light flux of a second wavelength range exiting from the light output aperture. The quality of the white light can be described by a color-rendering index. A color-rendering index of 100 indicates that the white light shining on a colored surface will reproduce the surface colors as seen by the human eye in an identical manner as light from the sun shining on the surface. A color-rendering index less than 100 indicates that the white light shining on a colored surface will give an apparent surface color that appears different to the human eye than the color seen by the human eye using sunlight. By changing the electrical power driving one of the LEDs, the ratio of the first light flux of a first wavelength range to the second light flux of a second wavelength range can be varied. By varying this ratio, the color-rendering index of the light exiting the light output aperture can also be varied in order to achieve the maximum value allowed for the combination of the two wavelength ranges.

Alternatively, LED 406a and LED 406b may emit light in different wavelength ranges at different times. For example, a first LED 406a may emit light of a first wavelength range in a first time period and a fraction of the light of a first wavelength range exits the light output aperture 404 in the first time period. In the first time period, LED 406b does not emit light. The second LED 406b may emit light of a second wavelength range, different than the light of a first wavelength range, in a second time period, different than the first time period, and a fraction of the light of a second wavelength range exits the light output aperture 404 in the second time period. The second time period does not overlap the first time period. In the second time period, LED 406a does not emit light. The first time period and the second time period are then repeated to produce light that alternates in color.

As in illumination system 100, part of the light emitted by the light source in illuminations system 400, in this case the two LEDs, is reflected and recycled back to the light source by the light-recycling envelope. This recycled light increases the effective brightness of the light source. The reflectivity of the light-recycling envelope is $R_E$. The reflectivity of reflecting layer 410a of LED 406a and reflecting layer 410b of LED 406b is $R_S$. The preferred values for $R_E$ and $R_S$ for illumination system 400 are identical to the preferred values listed previously for illumination system 100. Ideally, $R_E$ and $R_S$ should be as close to 100% as possible in order to maximize the efficiency and the maximum exiting radiance of the illumination system.

Recycling light emitted from a single LED back to the LED can increase the effective brightness of the LED. When the light source consists of two or more LEDs inside the light-recycling envelope, the effective brightness of the light source may also be increased when light of one LED is directed to and reflected by another LED, i.e. when light emitted by one part of the light source is recycled back to another part of the light source. Light rays 416 and 418 in FIG. 10C illustrate this effect. Light ray 416 is emitted from surface 412a of emitting layer 408a of LED 406a. Light ray 416 passes through the interior of the light-recycling envelope, is transmitted through surface 412b and emitting layer 408b of LED 406b and is reflected by reflecting layer 410b. Light ray 416 passes through emitting layer 408b and surface 412b a second time and reenters the interior of the light-recycling envelope 402. When light ray 416 emitted by LED 406a is reflected by LED 406b, it increases the effective radiance of LED 406b.

Light ray 418 is emitted from surface 412b of emitting layer 408b of LED 406b. Light ray 418 passes through the interior of the light-recycling envelope, is transmitted through surface 412a and emitting layer 408a of LED 406a and is reflected by reflecting layer 410a. Light ray 418 passes through emitting layer 408a and surface 412a a second time and reenters the interior of the light-recycling envelope 402. When light ray 418 emitted by LED 406b is reflected by LED 406a, it increases the effective radiance of LED 406a.

The total light-emitting area of the light source is area $A_S$. In this embodiment, the light source consists of two LEDs, so the total light-emitting area $A_S$ of the light source is the combined light-emitting area of the two LEDs. The light source emits light with a maximum intrinsic source radiance. As stated previously, the maximum intrinsic source radiance is determined by measuring the radiance for each LED in the light source when the light-recycling envelope is not present and when no other LED is directing light to the LED under measurement. The measurements are done with each LED powered at the same level as in illumination system 400 and are done as a function of emitting angle. Then from these radiance measurements, a maximum radiance value can be determined. This maximum value is defined as the maximum intrinsic source radiance.

The total light output aperture area is area $A_O$. Illumination system 400 has only one light output aperture 404, which therefore has area $A_O$. If $A_O$ is less than $A_S$ and $R_E$ and $R_S$ are each greater than 50% in illumination system 400, then it is possible for the maximum exiting radiance of illumination system 400 to be greater than the maximum intrinsic source radiance of the light source.

Figure 11A:
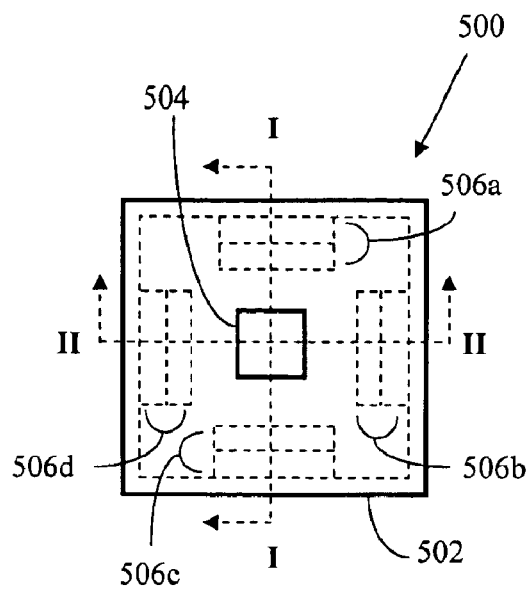
FIGS. 11A, 11B and 11C illustrate an embodiment of this invention that has four light-emitting diodes.
Figure 11B:
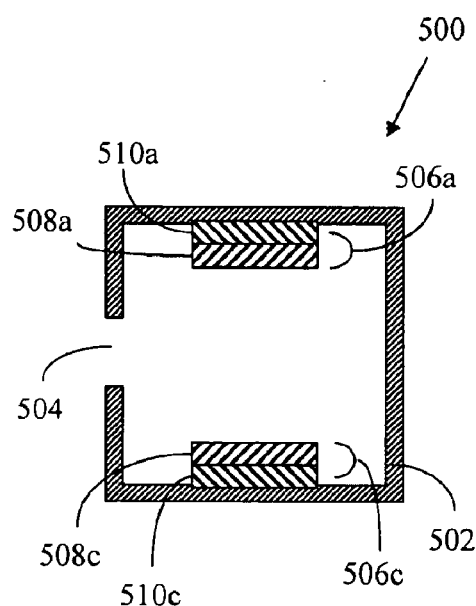
Figure 11C:
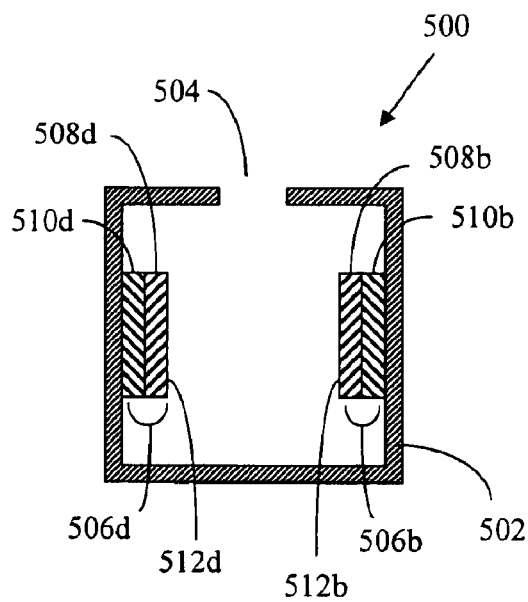

FIGS. 11A, 11B and 11C illustrate illumination system 500, which has a light source comprised of four LEDs, which are labeled LED 506a, LED 506b, LED 506c and LED 506d. Illumination system 500 is also comprised of light-recycling envelope 502 and light output aperture 504. The characteristics and properties of LED 506a, LED 506b, LED 506c, LED 506d, the light emitting layer 508A, 508b, 508C, 508D, and the light emitting reflecting layers 510A, 510B, 510C, 510D, and the light emitting surface of 512b, 512D, characteristics and properties of the respective elements in illumination system 100. However, each LED may emit light of a first wavelength range or each LED may emit light in different wavelength ranges. When the light source is comprised of four LEDs, there can be up to four wavelength ranges emitted by the light source. The up to four wavelength ranges can be emitted concurrently or the up to four wavelength ranges can each be emitted in different time periods.

In general, an illumination system may contain any number of LEDs on the inside surface of the light-recycling envelope as long as the LEDs do not overlap each other and do not overlap the light output aperture. The LEDs may cover the entire inside surface of the light-recycling envelope with the exception of the area of the light output aperture.

The reflectivity of the light-recycling envelope 502 is $R_E$. The reflectivity of reflecting layers 510a of LED 506a, 510b of LED 506b, 510c of LED 506c and 510d of LED 506d is $R_S$. The preferred values for $R_E$ and $R_S$ for illumination system 500 are identical to the preferred values listed previously for illumination system 100. Ideally, $R_E$ and $R_S$ should be as close to 100% as possible in order to maximize the efficiency and the maximum exiting radiance of the illumination system.

The total light-emitting area of the light source is area $A_S$. In illumination system 500, the light source consists of four LEDs, so the total light-emitting area $A_S$ of the light source is the combined light-emitting area of the four LEDs. The light source has a maximum intrinsic source radiance. The method for determining the maximum intrinsic source radiance has been described previously.

The total light output aperture area is area $A_O$. Illumination system 500 has only one light output aperture 504, which therefore has area $A_O$. If $A_O$ is less than $A_S$ and $R_E$ and $R_S$ are each greater than 50% in illumination system 500, then it is possible for the maximum exiting radiance of illumination system 500 to be greater than the maximum intrinsic source radiance of the light source.

Figure 12A:
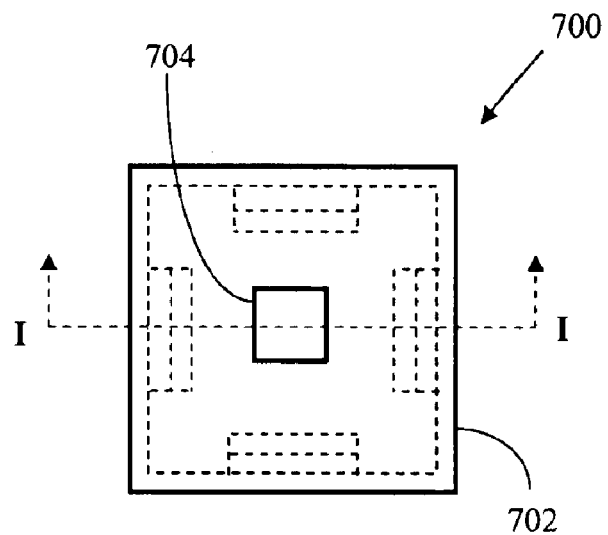
FIGS. 12A and 12B illustrate an embodiment of this invention that has twelve light-emitting diodes.
Figure 12B:
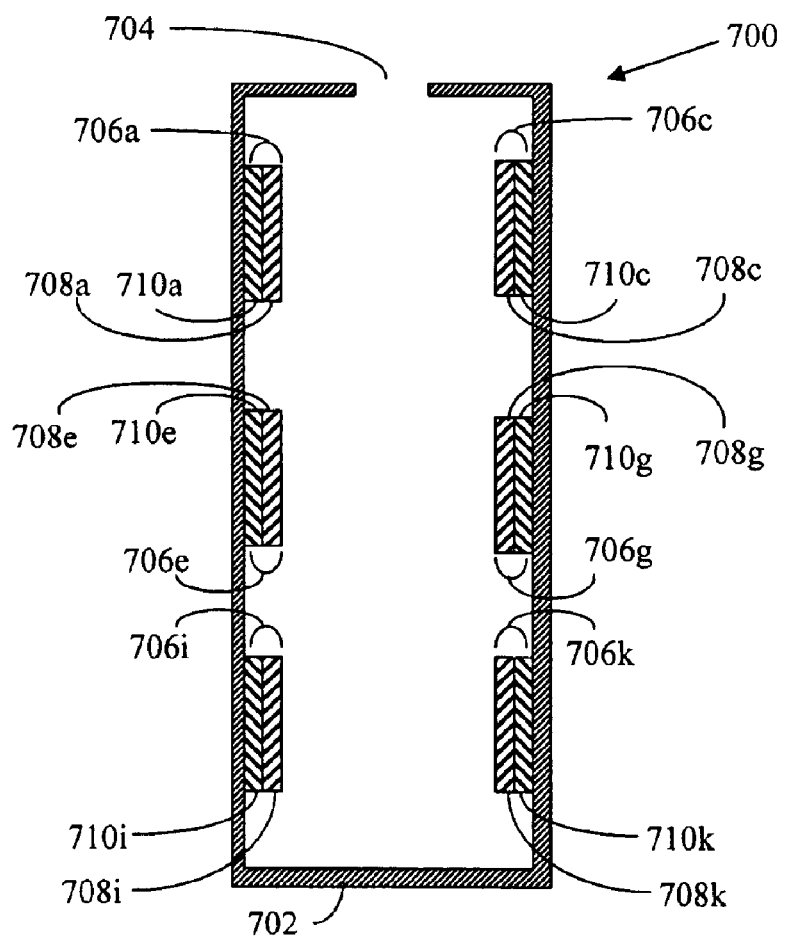

Another embodiment of this invention is illumination system 700 shown in FIGS. 12A and 12B. The light source in illumination system 700 is comprised of twelve LEDs, which are labeled LED 706a, LED 706b, LED 706c, LED 706d, LED 706e, LED 706f, LED 706g, LED 706h, LED 706i, LED 706j, LED 706k and LED 706l. Illumination system 700 is also comprised of light-recycling envelope 702 and light output aperture 704. The characteristics and properties of the LEDs, the light emitting layers 708a, 708b, 708c, 708d, 708e, 708f, 708g, 708h, 708i, 708j, 708l, the light-recycling envelope 702 and light output aperture 704 are identical to the characteristics and properties of the respective elements in illumination system 100. However, each LED may emit light of a first wavelength range or each LED may emit light in different wavelength ranges. When the light source is comprised of twelve LEDs, there can be up to twelve wavelength ranges emitted by the light source. The up to twelve wavelength ranges can be emitted concurrently or the up to twelve wavelength ranges can each be emitted in different time periods.

The light-recycling envelope 702 has a rectangular three-dimensional shape with two square ends as seen in FIGS. 12A and 12B. The light output aperture 704 is centered in one of the square ends. Each of the four rectangular sides contains three LEDs. The left side shown in FIG. 12B contains LED 706a, LED 706e and LED 706i. The right side shown in FIG. 12B contains LED 706c, LED 706g and LED 706k. The other two rectangular sides, each containing three LEDs, are not illustrated.

The reflectivity of the light-recycling envelope 702 is $R_E$. The reflectivity of reflecting layers 710a of LED 706a, 710b of LED 706b, 710c of LED 706c, 710d of LED 706d, 710e of LED 706e, 710f of LED 706f, 710g of LED 706g, 710h of LED 706h, 710i of LED 706i 710j of LED 706j, 710k of LED 706k and 710l of LED 706l is $R_S$. The preferred values for $R_E$ and $R_S$ for illumination system 700 are identical to the preferred values listed previously for illumination system 100. Ideally, $R_E$ and $R_S$ should be as close to 100% as possible in order to maximize the efficiency and the exiting radiance of the illumination system.

The total light-emitting area of the light source is area $A_S$. In illumination system 700, the light source consists of twelve LEDs, so the total light-emitting area $A_S$ of the light source is the combined light-emitting area of the twelve LEDs. The light source has a maximum intrinsic source radiance. The method for determining the maximum intrinsic source radiance has been described previously.

The total light output aperture area is area $A_O$. Illumination system 700 has only one light output aperture, which therefore has area $A_O$. If $A_O$ is less than $A_S$ and $R_E$ and $R_S$ are each greater than 50% in illumination system 700, then it is possible for the maximum exiting radiance of illumination system 700 to be greater than the maximum intrinsic source radiance of the light source.

The following EXAMPLES are presented to further explain the embodiments of this invention.

EXAMPLE 1

A computer simulation program is used to model the relative output radiance, the relative output luminance and the overall output efficiency of an illumination system that has a light source comprised of twelve identical LEDs inside a light-recycling envelope. Each LED has dimensions of 2 mm×2 mm, a total light-emitting area of 4 mm$^2$ and emits 0.2 watts or 11 lumens of light at 450 nm. The value of 11 lumens is calculated from the value in watts assuming a conversion factor of 55 lumens per watt at 450 nm. Each LED has a maximum intrinsic radiance, Radiance$_1$. The maximum intrinsic radiance of an LED is determined by measuring an identically constructed LED that is not enclosed in a light-recycling envelope and that is not reflecting light from any of the other LEDs. Since all the LEDs are equivalent, the maximum intrinsic radiance of one LED is equal to the maximum intrinsic radiance of the light source. Each LED is assumed to have a Lambertian output light distribution. The total light-emitting area $A_S$ of the twelve LEDs is 48 mm$^2$ and the total emitted 450-nm light flux from the twelve LEDs is 2.4 watts or 132 lumens. The three-dimensional, rectangular, light-recycling envelope has a square cross-section with inside dimensions of 2.8 mm×2.8 mm, inside length of 9 mm and a total inside area of 116.48 mm². The total inside area includes the total light-emitting area of the twelve LEDs and the area of the output aperture. The light output aperture of the light-recycling envelope has an area $A_O$ of 4.8 mm² so that $A_O/A_S$ equals 0.10, i.e. the area of the light output aperture is 10% of the total light-emitting area of the LEDs. If the light-recycling envelope has no losses (i.e. if the light reflectivity of the LEDs and the inside reflecting surfaces of the light-recycling envelope are 100%), the output radiance will be 10 times the radiance of the LEDs and the output efficiency will be 100%. However, the actual light-recycling envelope will have a light reflectivity less than 100% and will have losses. For simplicity, the specular reflectivity $R_S$ of the LEDs is assumed to be identical in magnitude to the diffuse reflectivity $R_E$ of the inside surfaces of the light-recycling envelope that are not covered by the LEDs. In the calculations, the reflectivity $R_S$ and the reflectivity $R_E$ are varied, having values of 40%, 50%, 60%, 70%, 80%, 90%, or 98%. The results are shown below in TABLE 1. The ratio, $Radiance_O/Radiance_I$, of the output radiance, $Radiance_O$, to the intrinsic radiance, $Radiance_1$, of the LEDs indicates the radiance enhancement resulting from light recycling. The calculated efficiency is the percentage of light flux generated by the LEDs that passes through the output aperture. The remainder of the light flux is lost due to absorption by the LEDs and the light-recycling envelope.

The computer modeling results indicate that when $R_S$ and $R_E$ equal 50% or less, there is no radiance enhancement ($Radiance_O/Radiance_1$ is less than 1) and the efficiency is low (less than 10%). As the reflectivity of the LEDs and the light-recycling envelope increases, the radiance enhancement and the efficiency increase. When $R_S$ equals 98% and $R_E$ equals 98%, the radiance enhancement factor of 6.87 indicates that the output radiance from the light output aperture of the illumination system is 6.87 times larger than the maximum intrinsic radiance of the light source.

TABLE 1

| Area ratio $A_O/A_S$ | Source $R_S$ (%) | Light-recycling envelope $R_E$ (%) | Efficiency (%) | Total light flux out (watts) | Radiance enhancement ($Radiance_O/Radiance_I$) |
|---|---|---|---|---|---|
| 0.10 | 40 | 40 | 7.9 | 0.19 | 0.79 |
| 0.10 | 50 | 50 | 9.2 | 0.22 | 0.91 |
| 0.10 | 60 | 60 | 10.8 | 0.26 | 1.08 |
| 0.10 | 70 | 70 | 13.8 | 0.33 | 1.38 |
| 0.10 | 80 | 80 | 19.2 | 0.46 | 1.89 |
| 0.10 | 90 | 90 | 31.1 | 0.75 | 3.11 |
| 0.10 | 98 | 98 | 68.7 | 1.65 | 6.87 |

EXAMPLE 2

The illumination system in EXAMPLE 2 is identical to EXAMPLE 1 except that the diffuse reflectivity $R_E$ of the inside surfaces of the light-recycling envelope is held constant at 98% and the specular reflectivity $R_S$ of the LEDs is varied from 5% to 98%. In this example, a computer simulation program is used to calculate the relative output radiance and the overall output efficiency of an illumination system that has a light source comprised of twelve identical LEDs inside a light-recycling envelope. The dimensions of the light-recycling envelope are listed in EXAMPLE 1. Each LED has a maximum intrinsic radiance, $Radiance_1$, which is equal to the maximum intrinsic radiance the light source. The maximum intrinsic radiance is determined as in EXAMPLE 1. The light output aperture of the light-recycling envelope has an area $A_O$ of 4.8 mm² so that $A_O/A_S$ equals 0.10, i.e. the area of the light output aperture is 10% of the total area of the LEDs. The ratio, $Radiance_O/Radiance_I$, of the output radiance, $Radiance_O$, to the intrinsic radiance, $Radiance_1$, of the LED sources indicates the radiance enhancement resulting from light recycling. The calculated efficiency is the percentage of light flux generated by the LEDs that passes through the output aperture. The remainder of the light flux is lost due to absorption by the LEDs and the light-recycling envelope. The results are shown below in TABLE 2. The computer modeling results indicate that for $R_S$ equal to 10% or less and $R_E$ equal to 98%, there is no radiance enhancement ($Radiance_O/Radiance_I$ is less than 1) and the efficiency is relatively low (less than 10%). Note that typical blackbody or gray body light sources have low reflectivity (less than 10%), and the results in this EXAMPLE indicate that such sources are not suitable for use in this invention. As the reflectivity of the sources increases, the radiance enhancement and the efficiency increase. When $R_S$ equals 98% and $R_E$ equals 98%, the radiance enhancement factor of 6.87 indicates that the maximum exiting radiance from the light output aperture of the illumination system is 6.87 times larger than the maximum intrinsic radiance of the LEDs.

TABLE 2

| Area ratio $A_O/A_S$ | Source $R_S$ (%) | Light-recycling envelope $R_E$ (%) | Efficiency (%) | Total light flux out (watts) | Radiance enhancement ($Radiance_O/Radiance_I$) |
|---|---|---|---|---|---|
| 0.10 | 5 | 98 | 9.3 | 0.22 | 0.93 |
| 0.10 | 10 | 98 | 9.7 | 0.23 | 0.97 |
| 0.10 | 20 | 98 | 10.8 | 0.26 | 1.08 |
| 0.10 | 30 | 98 | 12.4 | 0.30 | 1.24 |
| 0.10 | 40 | 98 | 13.9 | 0.33 | 1.39 |
| 0.10 | 50 | 98 | 16.2 | 0.39 | 1.62 |
| 0.10 | 60 | 98 | 19.2 | 0.46 | 1.92 |
| 0.10 | 70 | 98 | 23.7 | 0.57 | 2.37 |
| 0.10 | 80 | 98 | 31.1 | 0.75 | 3.11 |
| 0.10 | 90 | 98 | 44.2 | 1.06 | 4.42 |
| 0.10 | 98 | 98 | 68.7 | 1.65 | 6.87 |

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An illumination system, comprising:
    a light source, wherein said light source comprises at least one light-emitting diode that emits light, wherein said at least one light-emitting diode is further comprised of an emitting layer that emits said light and a reflecting layer that reflects said light, wherein the reflectivity of said reflecting layer is reflectivity $R_S$, wherein the total light-emitting area of said light source is area $A_S$ and wherein said light emitted by said light source has a maximum intrinsic source radiance;
    a light-recycling envelope, wherein said light-recycling envelope at least partially encloses said light source, wherein said light-recycling envelope has reflectivity $R_E$ and wherein said light-recycling envelope reflects and recycles part of said light back to said reflecting layer of said at least one light-emitting diode; and at least one light output aperture, wherein said at least one light output aperture is located in a surface of said light-recycling envelope, wherein the total light output aperture area is area $A_O$, wherein said area $A_O$ is less than said area $A_S$, wherein said light source and said light-recycling envelope direct at least a fraction of said light out of said light-recycling envelope through said at least one light output aperture and wherein said fraction of said light exits said at least one light output aperture as incoherent light having a maximum exiting radiance.

2. The illumination system as in claim 1, wherein said maximum exiting radiance is greater than said maximum intrinsic source radiance.

3. The illumination system as in claim 1, wherein said at least one light-emitting diode is chosen from the group consisting of an inorganic light-emitting diode and an organic light-emitting diode and an organic light-emitting diode.

4. The illumination system as in claim 1, wherein said reflecting layer of said at least one light-emitting diode is located on an inside surface of said light-recycling envelope.

5. The illumination system as in claim 1, wherein said light is greater than 200 nanometers in wavelength and less than 3000 nanometers in wavelength.

6. The illumination system as in claim 5, wherein said light is ultraviolet light that is greater than 200 nanometers and less than 400 nanometers in wavelength.

7. The illumination system as in claim 5, wherein said light is infrared light that is greater than 700 nanometers and less than 3000 nanometers in wavelength.

8. The illumination system as in claim 1, wherein said light source is a plurality of light-emitting diodes that emit said light.

9. The illumination system as in claim 1, wherein said light source comprises a first light-emitting diode that emits a first light flux of a first wavelength range and a second light-emitting diode that concurrently emits a second light flux of a second wavelength range, different than said first wavelength range, and wherein a fraction of said first light flux of a first wavelength range and a fraction of said second light flux of a second wavelength range exit said at least one light output aperture as light of a composite color.

10. The illumination system as in claim 9, wherein said second light flux of said second wavelength range emitted by said second light-emitting diode is modified to change the color and the color-rendering index of said light of a composite color.

11. The illumination system as in claim 1, wherein said light source comprises a first light-emitting diode and a second light-emitting diode, wherein said first light emitting diode emits light of a first wavelength range in a first time period and a fraction of said light of a first wavelength range exits said at least one light output aperture in said first time period, wherein said second light-emitting diode emits light of a second wavelength range, different than said first wavelength range, in a second time period, different than the first time period, and a fraction of said light of said second wavelength range exits said at least one light output aperture in said second time period and wherein said first time period and said second time period are repeated to produce a light output that alternates in color.

12. The illumination system as in claim 1, wherein said reflectivity $R_S$ is at least 50%.

13. The illumination system as in claim 1, wherein said reflectivity $R_S$ is at least 70%.

14. The illumination system as in claim 1, wherein said reflectivity $R_S$ is at least 90%.

15. The illumination system as in claim 1, wherein said light source comprises a light-emitting diode and a light guide, wherein said light-emitting diode is located outside said light-recycling envelope, wherein said light guide has an input surface adjacent to said emitting layer of said light-emitting diode and an output surface located inside said light-recycling envelope, wherein said light guide transports said light from said emitting layer to said light-recycling envelope, wherein said light guide transports part of said light from said light-recycling envelope back to said reflecting layer of said light-emitting diode as recycled light and wherein said light guide transports said recycled light reflected by said reflecting layer back to said light-recycling envelope.

16. The illumination system as in claim 1, wherein said light-recycling envelope is at least partially filled with a light-transmitting solid that is in contact with at least part of the surface of said emitting layer of said light-emitting diode and wherein said light-transmitting solid improves the efficiency of light emission from said emitting layer.

17. The illumination system as in claim 16, wherein said light-transmitting solid further comprises an ultrafine powder, wherein said ultrafine powder has a particle size less than 300 nanometers, wherein said ultrafine powder is made from a material that has a bulk refractive index greater than 1.60 and wherein said ultrafine powder increases the effective refractive index of said light-transmitting solid.

18. The illumination system as in claim 17, wherein said material that has a bulk refractive index greater than 1.60 is selected from the group comprising tin oxide, titanium oxide, zinc oxide, cerium oxide and antimony pentoxide.

19. The illumination system as in claim 1, wherein said light-recycling envelope is constructed from a bulk material that is intrinsically reflective.

20. The illumination system as in claim 1, wherein the inside surfaces of said light-recycling envelope are covered with a reflective coating.

21. The illumination system as in claim 20, wherein said reflective coating is a diffuse reflector.

22. The illumination system as in claim 20, wherein said reflective coating is a specular reflector.

23. The illumination system as in claim 20, wherein said reflective coating is a diffuse reflector that is backed by a specular reflector.

24. The illumination system as in claim 1, wherein said reflectivity $R_E$ is at least 50%.

25. The illumination system as in claim 1, wherein said reflectivity $R_E$ is at least 70%.

26. The illumination system as in claim 1, wherein said reflectivity $R_E$ is at least 90%.

27. The illumination system as in claim 1, wherein said area $A_O$ is less than or equal to 50% of said area $A_S$.

28. The illumination system as in claim 1, wherein said area $A_O$ is less than or equal to 30% of said area $A_S$.

29. The illumination system as in claim 1, wherein said area $A_O$ is less than or equal to 10% of said area $A_S$.

30. The illumination system as in claim 1, wherein said area $A_O$ is less than 25 square millimeters.

31. The illumination system as in claim 1, wherein said area $A_O$ is less than 10 square millimeters.

32. The illumination system as in claim 1, wherein said illumination system further comprises a plurality of said light output apertures.

33. The illumination system as in claim 1, further comprising a planar reflective polarizer, wherein said planar reflective polarizer is located in the light output optical path, wherein said planar reflective polarizer is located adjacent to said at least one light output aperture of said light-recycling envelope, wherein said planar reflective polarizer reflects and recycles light of a first polarization state back into said light-recycling envelope and wherein said planar reflective polarizer transmits light of a second polarization state.

34. The illumination system as in claim 1, further comprising at least one light-collimating element, wherein said at least one light-collimating element has an input surface adjacent to said at least one light output aperture which accepts uncollimated light, wherein said at least one light-collimating element partially collimates said uncollimated light and wherein said at least one light-collimating element has an output surface through which the partially collimated light is transmitted.

35. The illumination system as in claim 34, wherein said at least one light-collimating element is chosen from the group consisting of a convex lens, a tapered light guide and a compound parabolic reflector.

36. The illumination system as in claim 34, further comprising a beam-splitting prism polarizer, wherein said beam-splitting prism polarizer is located in the light output optical path adjacent to said output surface of said light-collimating element, wherein said beam-splitting prism polarizer has an input surface, a first output surface perpendicular to the input surface, a second output surface opposite the input surface and a partially reflecting diagonal surface, wherein light of a first polarization state transmitted through said output surface of said light-collimating element and entering said input surface of said beam-splitting prism polarizer is reflected by said partially reflecting diagonal surface and transmitted through said first output surface of said beam-splitting prism polarizer and wherein light of a second polarization state transmitted through said output surface of said light-collimating element and entering said input surface of said beam-splitting prism polarizer is transmitted through said second output surface of said beam-splitting prism polarizer.

37. The illumination system as in claim 36, further comprising a light reflector positioned adjacent and parallel to said first output surface of said beam-splitting prism polarizer, wherein said light of said first polarization state exiting said first output surface is reflected and recycled back through said first output surface, through said beam-splitting prism polarizer and through said light-collimating element into said light-recycling envelope.

38. The illumination system as in claim 36, further comprising a second light-collimating element and a second illumination system operating in combination, wherein said second illumination system comprises a second light-emitting diode surrounded by a second light-recycling envelope having a second light output aperture, wherein said second light-collimating element has an input surface and an output surface, wherein said input surface of said second light-collimating element is adjacent to said second light output aperture of said second illumination system, wherein said output surface of said second light-collimating element is adjacent to said first output surface of said beam-splitting prism polarizer and wherein said light of a first polarization state exiting said first output surface of said beam-splitting prism polarizer is transmitted backwards through said output surface of said second light-collimating element and is recycled through said second light-collimating element and into said second illumination system.

* * * * *